(12) United States Patent
Chung et al.

(10) Patent No.: US 12,405,645 B2
(45) Date of Patent: Sep. 2, 2025

(54) HINGE STRUCTURE WITH AIR VENT AND ELECTRONIC DEVICE HAVING THE SAME

(71) Applicant: SAMSUNG ELECTRONICS CO., LTD., Suwon-si (KR)

(72) Inventors: Haein Chung, Suwon-si (KR); Hansang Kim, Suwon-si (KR); Kunwoo Baek, Suwon-si (KR); Giyeon Ko, Suwon-si (KR); Jonghyun Lim, Suwon-si (KR); Chihwan Jeong, Suwon-si (KR); Hui Jeong, Suwon-si (KR); Myoungjun Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 289 days.

(21) Appl. No.: 18/318,003

(22) Filed: May 16, 2023

(65) Prior Publication Data
US 2023/0280804 A1 Sep. 7, 2023

Related U.S. Application Data

(63) Continuation of application No. PCT/KR2022/021072, filed on Dec. 22, 2022.

(30) Foreign Application Priority Data

Dec. 28, 2021 (KR) .................. 10-2021-0189826
Apr. 12, 2022 (KR) .................. 10-2022-0044982

(51) Int. Cl.
*G06F 1/20* (2006.01)
*G06F 1/16* (2006.01)
*H05K 7/20* (2006.01)

(52) U.S. Cl.
CPC .............. *G06F 1/20* (2013.01); *G06F 1/1616* (2013.01); *G06F 1/1681* (2013.01); *H05K 7/20145* (2013.01)

(58) Field of Classification Search
CPC ........ G06F 1/20; G06F 1/1616; G06F 1/1681; G06F 1/203; G06F 2200/202; H05K 7/20145
See application file for complete search history.

(56) References Cited

U.S. PATENT DOCUMENTS 6,118,655 A * 9/2000 Mecredy, III ........... G06F 1/203
361/679.52
8,926,414 B1 * 1/2015 Kirkpatrick ............. G06F 1/203
361/679.41
(Continued)

FOREIGN PATENT DOCUMENTS

CN 103294107 A 9/2013
JP 2015049591 A 3/2015
(Continued)

OTHER PUBLICATIONS

European Search Report for European Patent Application No. 22916610.3 dated Dec. 13, 2024.

*Primary Examiner* — Abhishek M Rathod
(74) *Attorney, Agent, or Firm* — CANTOR COLBURN LLP

(57) ABSTRACT

An electronic device includes first and second housings rotatable relative to each other, a fan inside the housing, and a hinge structure rotatably connecting the first and second housings to each other. The hinge structure includes a vent member rotating together with rotation of the first and second housings. The vent member includes first and second portions which guide first air flow between intake and exhaust openings together with operation of the fan. The first and second housings which face each other define a first (Continued)

angle therebetween, the first and second housings which are maximally rotated define a second angle therebetween, and the first and second housings forming a third angle between the first angle and the second angle, rotates the vent member to dispose the first and second vent portions together guiding air flow in different directions, relative to the front side of the electronic device.

20 Claims, 25 Drawing Sheets

(56) References Cited

U.S. PATENT DOCUMENTS

| | | | |
|---|---|---|---|
| 8,982,555 B2* | 3/2015 | Nishi | G06F 1/1616 |
| | | | 174/15.1 |
| 9,268,377 B2 | 2/2016 | Macdonald et al. | |
| 9,575,524 B1 | 2/2017 | Prather et al. | |
| 10,551,881 B2* | 2/2020 | Ho | G06F 1/1681 |
| 11,314,297 B1* | 4/2022 | Degner | G06F 1/206 |
| 12,021,296 B2* | 6/2024 | Yoo | H01Q 9/42 |
| 2002/0075647 A1* | 6/2002 | DiFonzo | H05K 7/20172 |
| | | | 361/679.48 |
| 2006/0114653 A1* | 6/2006 | Seto | G06F 1/203 |
| | | | 361/679.48 |
| 2008/0128119 A1* | 6/2008 | Ali | G06F 1/203 |
| | | | 165/122 |
| 2010/0165567 A1* | 7/2010 | Shih | G06F 1/1667 |
| | | | 361/679.48 |
| 2013/0077241 A1* | 3/2013 | Senatori | G06F 1/203 |
| | | | 361/694 |
| 2013/0327507 A1* | 12/2013 | Degner | H05K 7/2039 |
| | | | 361/695 |
| 2015/0169014 A1 | 6/2015 | Rivera et al. | |
| 2017/0010637 A1* | 1/2017 | Garelli | G06F 1/203 |
| 2018/0284858 A1* | 10/2018 | Lee | G06F 1/1618 |
| 2020/0187381 A1 | 6/2020 | Degner et al. | |
| 2021/0018965 A1 | 1/2021 | Watanabe et al. | |
| 2021/0096618 A1* | 4/2021 | Radhakrishnan | G06F 1/206 |
| 2021/0356999 A1* | 11/2021 | Chao | H05K 7/20145 |

FOREIGN PATENT DOCUMENTS

| | | |
|---|---|---|
| KR | 100746966 B1 | 8/2007 |
| WO | 2011146064 A1 | 11/2011 |
| WO | 2018183135 A1 | 10/2018 |

* cited by examiner

HINGE STRUCTURE WITH AIR VENT AND ELECTRONIC DEVICE HAVING THE SAME

CROSS-REFERENCE TO RELATED APPLICATIONS

This application is a continuation application of International Application No. PCT/KR2022/021072 designating the United States, filed on Dec. 22, 2022, at the Korean Intellectual Property Receiving Office and claiming priority to Korean Patent Application No. 10-2021-0189826, filed on Dec. 28, 2021, and Korean Patent Application No. 10-2022-0044982, filed on Apr. 12, 2022, at the Korean Intellectual Property Office, the disclosures of which are incorporated by reference herein in their entireties.

BACKGROUND

1. Field

The disclosure relates to a hinge structure having a vent and an electronic device including the same.

2. Description of Related Art

An electronic device such as a laptop personal computer (PC) may include a heat dissipation structure for controlling a temperature of the electronic device, by dissipating heat generated within the electronic device during use thereof, to the outside of the electronic device and/or the heat-generating structure. For example, the electronic device may include an air vent structure for dissipating heat to the outside, via air circulation. To satisfy consumer tendency to value design aesthetics, a heat dissipation structure that is minimally exposed to the outside but still functions to dissipate heat from the electronic device is being developed.

SUMMARY

Providing improved portability and aesthetics, electronic devices that are thinner and smaller are in demand. Various components are disposed inside the electronic device, and various technologies for removing heat generated from the components while the electronic device is being used, are being developed.

In the case of an electronic device such as a laptop personal computer (PC), a fan component for performing a heat dissipation function, via air circulation, may be embedded within the electronic device. To effectively perform a heat dissipation function via air circulation, a vent structure for guiding the flow of air introduced into the electronic device, and air discharged from the electronic device, may be used. When an amount of space occupied inside the electronic device is reduced and exposure of the vent structure is minimized, miniaturization and external aesthetics of the electronic device may be improved.

According to an embodiment of the disclosure, an electronic device including a hinge structure in which a vent structure is formed may be provided.

According to an embodiment of the disclosure, folding of the electronic device may be implemented via the hinge structure in which the vent structure is formed while a flow direction of air circulating in the electronic device is guided.

According to an embodiment of the disclosure, by limiting a rotation angle of the hinge structure to an angle within a set range, a heat dissipation function may be effectively implemented even when the electronic device is positioned at any of various angles while being used.

The technical goals to be achieved through embodiments of the present disclosure are not limited to those described above, and other technical goals not mentioned above will be clearly understood by one of ordinary skill in the art from the following description.

According to embodiments of the disclosure, an electronic device includes a first housing including a first surface and a second surface opposite to the first surface, a second housing including a third surface and a fourth surface opposite to the third surface, a display visually exposed through the third surface, one or more fan component disposed in a first space inside the first housing, and a hinge structure rotatably connecting the first housing and the second housing about a rotation axis such that an angle between the first surface and the third surface changes between a first angle in a first state in which the first surface and the third surface face each other and a second angle in a second state in which the first surface and the third surface are maximally widened, where the first housing includes an opening formed at a position facing the hinge structure, and including an intake portion configured to suck air into the first space from the outside and an exhaust portion configured to discharge air from the first space to the outside, according to an operation of the fan component, and the hinge structure includes a vent member configured to rotate about the rotation axis, and in which a first vent portion for guiding air flow between the intake portion and the outside, and a second vent portion for guiding air flow between the exhaust portion and the outside are formed, and in a third state in which the angle between the first surface and the third surface forms a third angle between the first angle and the second angle, the first vent portion and the second vent portion guide the air flow in different directions from each other.

According to embodiments of the disclosure, an electronic device includes a first housing including a first surface and a second surface opposite to the first surface, a second housing including a third surface and a fourth surface opposite to the third surface, and configured to rotate about a rotation axis relative to the first housing allowing change between a first state in which the third surface forms a first angle relative to the first surface and a second state in which the third surface forms a second angle relative to the first surface, a display disposed on the third surface, one or more fan component disposed in a first space inside the first housing, and a hinge structure disposed along the rotation axis and rotatably connecting the first housing and the second housing, where the first housing includes an opening formed at an end of the first housing facing the hinge structure, the opening being open in a direction parallel to the rotation axis, and including an intake portion configured to suck external air into the first space and an exhaust portion configured to discharge air from the first space to the outside, according to an operation of the fan component, and the hinge structure includes a vent member having a longitudinal direction parallel to the rotation axis and including a first vent portion formed in a portion overlapping the intake portion and a second vent portion formed in a portion overlapping the exhaust portion, in a state in which the opening is viewable, and in a state in which the third surface has an angle greater than or equal to a third angle between the first angle and the second angle relative to the first surface, the intake portion sucks air from a space between the first surface and the third surface through the first vent portion, and the exhaust portion exhausts air between the second surface and the fourth surface through the second vent portion.

According to embodiments of the disclosure, an electronic device includes a first housing including a first surface and a second surface opposite to the first surface, a second housing including a third surface and a fourth surface opposite to the third surface, a display visually exposed through the third surface, one or more fan component disposed in a first space inside the first housing, and a hinge structure rotatably connecting the first housing and the second housing allowing change between a first state in which the first surface and the third surface form a first angle facing each other and a second state in which the first surface and the third surface form a second angle, where the first housing includes an opening including an intake portion configured to suck air into the first space from the outside and an exhaust portion configured to discharge air from the first space to the outside, according to an operation of the fan component, and the hinge structure includes a rotating member connecting the first housing and the second housing and configured to rotate about the rotation axis according to the rotation of the second housing relative to the first housing, based on a third state in which the first surface and the third surface form a third angle between the first angle and the second angle, a vent member including a first vent portion through which the intake portion communicates with the outside, and a second vent portion through which the exhaust portion communicates with the outside, and a connecting member connecting the rotating member and the vent member, and the connecting member transmits a rotational force of the rotating member to the vent member during a change between the first state and the third state, and prevents transmission of the rotational force of the rotating member to the vent member during a change between the third state and the second state.

According to embodiments of the disclosure, an electronic device includes a first housing comprising a first surface at a front side of the electronic device, a second surface which is opposite to the first surface and at a rear side of the electronic device, an inner space in communication with an outside of the first housing, an intake opening connected to the inner space and through which air flows to the inner space from the outside of the first housing, and an exhaust opening connected to the inner space and through which air flows from the inner space to the outside of the first housing, a second housing comprising a third surface at the front side of the electronic device and a fourth surface which is opposite to the third surface and at the rear side of the electronic device, a display visually exposed at the third surface, a fan which is in the inner space of the first housing, and a hinge structure rotatably connecting the first housing and the second housing to each other, about a rotation axis. The hinge structure includes a vent member which rotates about the rotation axis, together with rotation of the first housing relative to the second housing. The vent member includes a first vent portion which guides first air flow between the intake opening and an outside of the electronic device, together with operation of the fan, and a second vent portion which guides second air flow between the exhaust opening and the outside of the electronic device, together with the operation of the fan. The first surface and the third surface which face each other define a first angle between the first housing and the second housing, the first surface and the third surface which are disposed at a maximum rotational distance from each other define a second angle between the first housing and the second housing, and the first surface and the third surface which define a third angle between the first angle and the second angle, rotates the vent member to dispose the first vent portion guiding the first air flow in a direction relative to the front side of the electronic device, together with the second vent portion guiding the second air flow in a different direction from that of the first vent portion, relative to the front side of the electronic device.

According to embodiments of the disclosure, an electronic device includes a first housing comprising a first surface at a front side of the electronic device, a second surface which is opposite to the first surface and at a rear side of the electronic device, an inner space in communication with an outside of the first housing, an intake opening connected to the inner space and through which air flows to the inner space from the outside of the first housing, and an exhaust opening connected to the inner space and through which air flows from the inner space to the outside of the first housing, a second housing rotatable relative to the first housing, about a rotation axis, the second housing comprising a third surface at the front side of the electronic device, and a fourth surface which is opposite to the third surface and at the rear side of the electronic device, a display visually exposed at the third surface, a fan which is in the inner space of the first housing, and a hinge structure at the rotation axis and rotatably connecting the first housing and the second housing to each other. The hinge structure includes a vent member which is extended parallel to the rotation axis. The vent member comprising a first vent portion which faces the intake opening, and a second vent portion which faces the exhaust opening. the vent member rotates about the rotation axis, together with rotation of the first housing relative to the second housing, and guides air flow relative to the electronic device, together with operation of the fan. The first surface and the third surface which face each other define a first angle between the first housing and the second housing, the first surface and the third surface which are disposed at a maximum rotational distance from each other define a second angle between the first housing and the second housing, and the first surface and the third surface which define a third angle between the first angle and the second angle, rotates the vent member to dispose the first vent portion guiding a first air flow from the first surface and the third surface each at the front side of the electronic device, toward the intake opening of the first housing, together with defining a second air flow guided by the second vent portion, from the exhaust opening of the first housing, toward the second surface and the fourth surface each at the rear side of the electronic device.

According to embodiments of the disclosure, an electronic device includes a first housing comprising a first surface at a front side of the electronic device, a second surface which is opposite to the first surface and at a rear side of the electronic device, an inner space in communication with an outside of the first housing, an intake opening connected to the inner space and through which air flows to the inner space from the outside of the first housing, and an exhaust opening connected to the inner space and through which air flows from the inner space to outside the first housing, a second housing comprising a third surface at the front side of the electronic device, and a fourth surface which is opposite to the third surface and at the rear side of the electronic device, a display visually exposed at the third surface, a fan which is in the inner space of the first housing, and a hinge structure rotatably connecting the first housing and the second housing to each other. The hinge structure includes a vent member which rotates about the rotation axis, together with rotation of the first housing relative to the second housing. The vent member includes a first vent portion which guides first air flow between the intake opening and outside of the electronic device, together with operation of the fan, and a second vent portion which guides second air flow between the exhaust opening and the outside of the electronic device, together with operation of the fan, and a rotational connecting member which is fixed to and rotatable together with the second housing, connects the second housing to the hinge structure, at the vent member, and transmits a rotational force from the rotation of the first housing relative to the second housing, to the vent member. The first surface and the third surface which face each other define a first angle between the first housing and the second housing, the first surface and the third surface which are disposed at a maximum rotational distance from each other define a second angle between the first housing and the second housing, the rotation of the first housing relative to the second housing, between the first angle and a third angle between the first angle and the second angle, rotates the rotational connecting member together with the vent member; and the rotation of the first housing relative to the second housing, between the third angle and the second angle, prevents transmission of the rotational force to the vent member, to stop rotation of the vent member.

According to embodiments of the disclosure, by forming a vent structure through which air may pass in the hinge structure, a space occupied by the vent structure in the electronic device may be minimized while an internal space of the electronic device may be simplified.

According to embodiments of the disclosure, by limiting a rotation angle of a vent member in which a vent portion is formed to a set range, intake of air to the electronic device and exhaust of air to the outside may be guided in a predetermined direction when the electronic device is in an unfolded state at a particular angle or more.

According to embodiments of the disclosure, by separately forming each vent portion of the vent member, mixing of air introduced into the electronic device and air discharged from the electronic device may be prevented.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
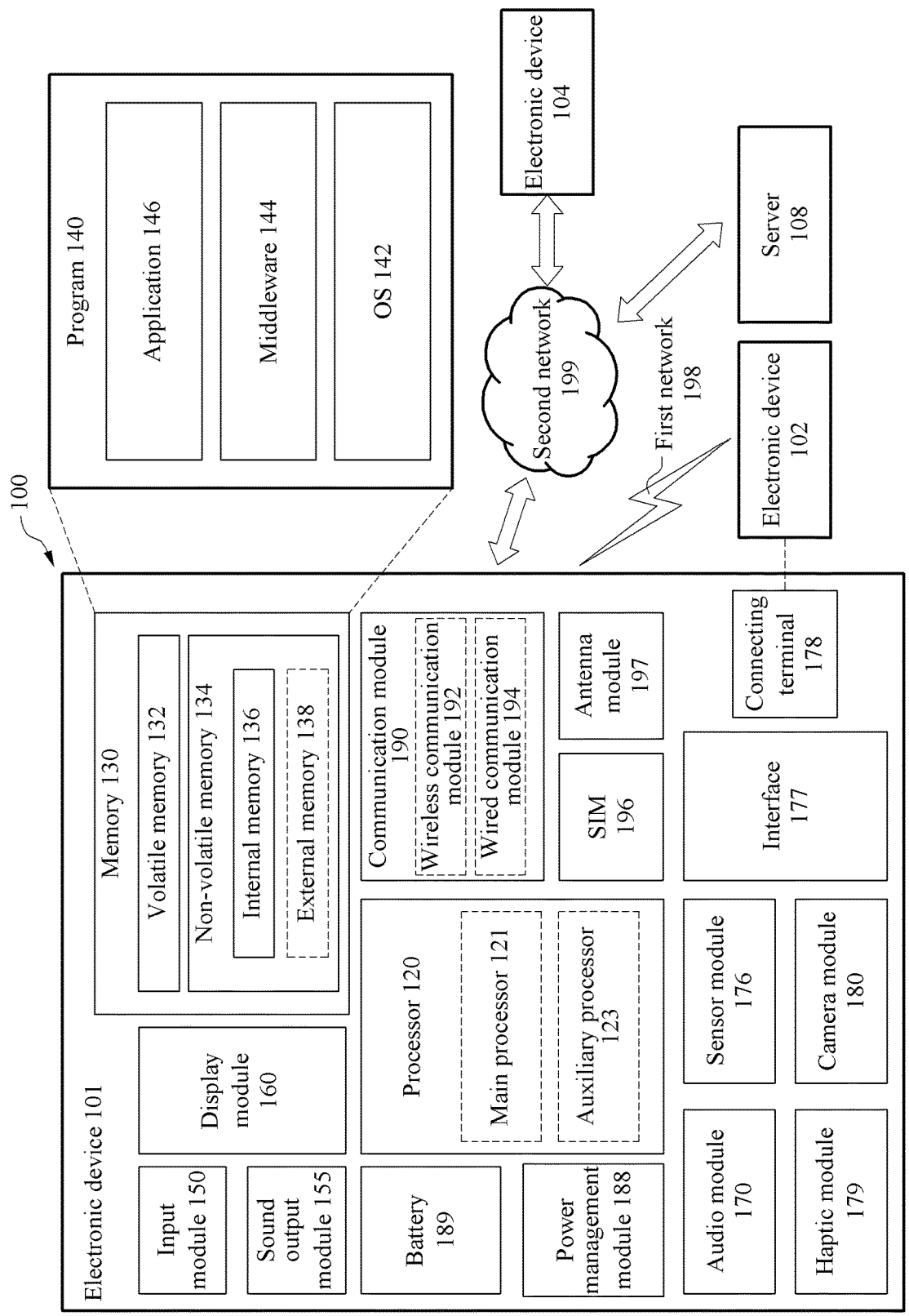
FIG. 1 is a block diagram illustrating an electronic device in a network environment according to an embodiment.

Hereinafter, embodiments will be described in detail with reference to the accompanying drawings. When describing the embodiments with reference to the accompanying drawings, like reference numerals refer to like elements and a repeated description related thereto will be omitted.

FIG. 1 is a block diagram illustrating an electronic device in a network environment according to one embodiment. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to one embodiment, the electronic device 101 may communicate with the electronic device 104 via the server 108. According to one embodiment, the electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to one embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to one embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be adapted to consume less power than the main processor 121 or to be predetermined to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to one embodiment, the auxiliary processor 123 (e.g., an ISP or a CP) may be implemented as a portion of another component (e.g., the camera module 180 or the communication module 190) that is functionally related to the auxiliary processor 123. According to one embodiment, the auxiliary processor 123 (e.g., an NPU) may include a hardware structure specified for artificial intelligence (AI) model processing. An AI model may be generated by machine learning. The machine learning may be performed by, for example, the electronic device 101, in which artificial intelligence is performed, or performed via a separate server (e.g., the server 108). Learning algorithms may include, but are not limited to, for example, supervised learning, unsupervised learning, semi-supervised learning, or reinforcement learning algorithms. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. According to one embodiment, the receiver may be implemented separately from the speaker or as a part of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to one embodiment, the display module 160 may include a touch sensor adapted to sense a touch, or a pressure sensor adapted to measure an intensity of a force incurred by the touch.

The audio module 170 may convert a sound into an electric signal or vice versa. According to one embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to one embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to one embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to one embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to one embodiment, the haptic module 179 may include, for example, a motor, a piezoelectric element, or an electric stimulator.

The camera module 180 may capture a still image and moving images. According to one embodiment, the camera module 180 may include one or more lenses, image sensors, ISPs, or flashes.

The power management module 188 may manage power supplied to the electronic device 101. According to one embodiment, the power management module 188 may be implemented as, for example, at least a part of a power management integrated circuit (PMIC).

The battery 189 may supply power to at least one component of the electronic device 101. According to one embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to one embodiment, the communication module 190 may include a wireless communication module 192 (e.g., a cellular communication module, a short-range wireless communication module, or a global navigation satellite system (GNSS) communication module) or a wired communication module 194 (e.g., a local region network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide region network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to one embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to one embodiment, the antenna module 197 may include an antenna including a radiating element including a conductive material or a conductive pattern formed in or on a substrate (e.g., a printed circuit board (PCB)). According to one embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to one embodiment, another component (e.g., a radio frequency integrated circuit (RFIC)) other than the radiating element may be additionally formed as a part of the antenna module 197.

According to an example embodiments, the antenna module 197 may form a mmWave antenna module. According to one embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to one embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to one embodiment, all or some of operations to be executed by the electronic device 101 may be executed at one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, may request one or more external electronic devices to perform at least part of the function or the service. The one or more external electronic devices receiving the request may perform the at least part of the function or service, or an additional function or an additional service related to the request, and may transfer a result of the performance to the electronic device 101. The electronic device 101 may provide the result, with or without further processing the result, as at least part of a response to the request. To that end, cloud computing, distributed computing, mobile edge computing (MEC), or client-server computing technology may be used, for example. The electronic device 101 may provide ultra low-latency services using, e.g., distributed computing or MEC. In one embodiment, the external electronic device (e.g., the electronic device 104) may include an Internet-of-things (IoT) device. The server 108 may be an intelligent server using machine learning and/or a neural network. According to one embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic device may include, for example, a portable communication device (e.g., a smartphone), a computer device, a portable multimedia device, a portable medical device, a camera, a wearable device, or a home appliance device. According to one embodiment of the disclosure, the electronic device is not limited to those described above.

It should be appreciated that various embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. As used herein, a reference number may indicate a singular element or a plurality of the element. For example, a reference number labeling a singular form of an element within the drawing figures may be used to reference a plurality of the singular element within the text of specification.

It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Terms such as "first", "second", or "first" or "second" may simply be used to distinguish the component from other components in question, and do not limit the components in other aspects (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element. In contrast, when an element (e.g., a first element) is referred to, such as being "directly operatively" or "directly communicatively", as "directly coupled with," "directly coupled to," "directly connected with," or "directly connected to" another element (e.g., a second element), it means that no third element is between the elements.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used in connection with various example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to one embodiment, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to one embodiment of the disclosure may be included and provided in a computer program product. The computer program product may be traded as a product between a seller and a buyer. The computer program product may be distributed in the form of a machine-readable storage medium (e.g., a compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to embodiments, each component (e.g., a module or a program) of the above-described components may include a single entity or multiple entities, and some of the multiple entities may be separately disposed in different components. According to embodiments, one or more of the above-described components may be omitted, or one or more other components may be added. Alternatively or additionally, a plurality of components (e.g., modules or programs) may be integrated into a single component. In such a case, according to one embodiment, the integrated component may still perform one or more functions of each of the plurality of components in the same manner or in a similar manner as they are performed by a corresponding one of the plurality of components before the integration. According to one embodiment, operations performed by the module, the program, or another component may be carried out sequentially, in parallel, repeatedly, or heuristically, or one or more of the operations may be executed in a different order or omitted, or one or more other operations may be added.

Figure 2A:
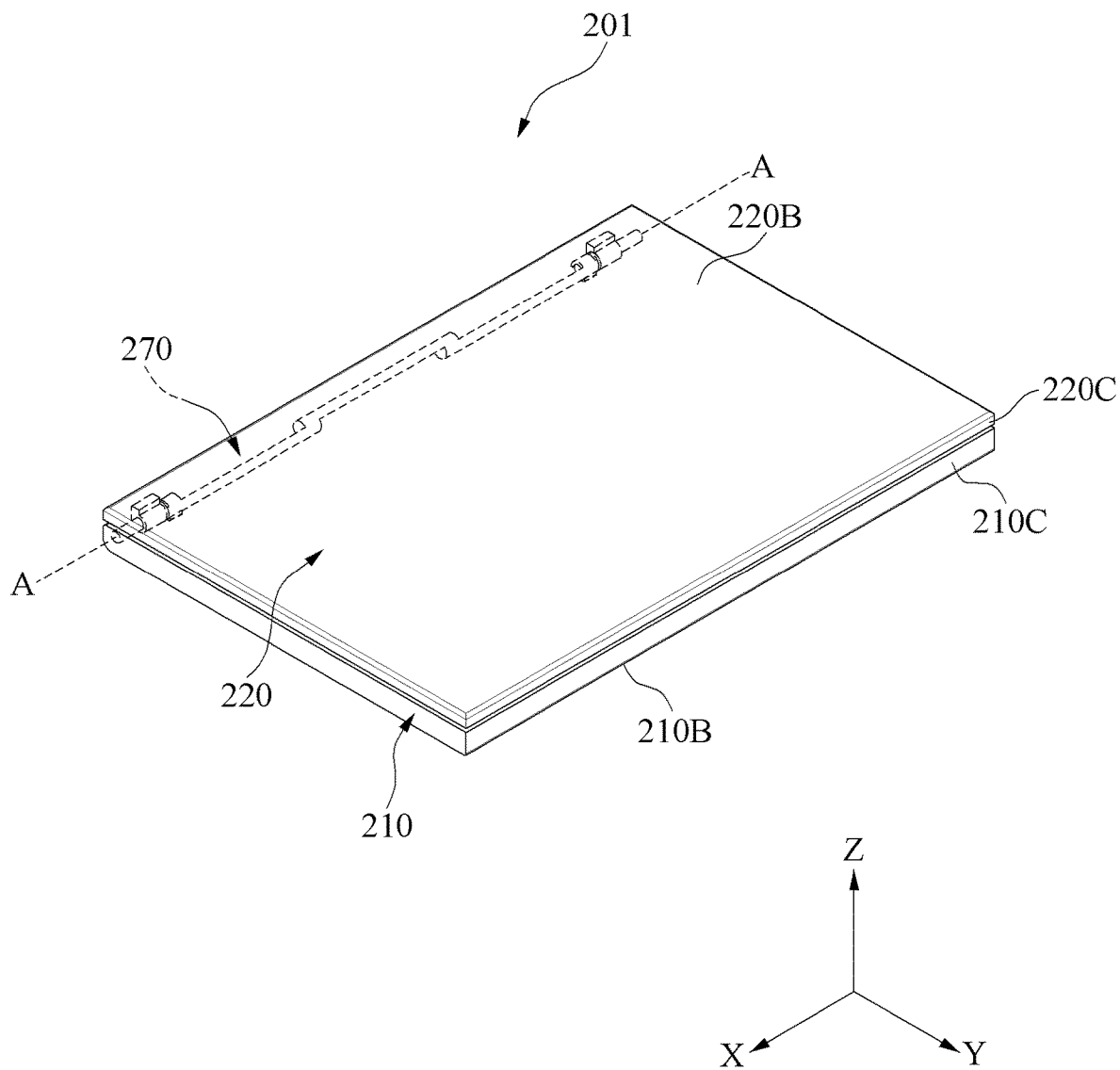
FIG. 2A is a perspective view illustrating an electronic device which is closed according to an embodiment.
Figure 2B:
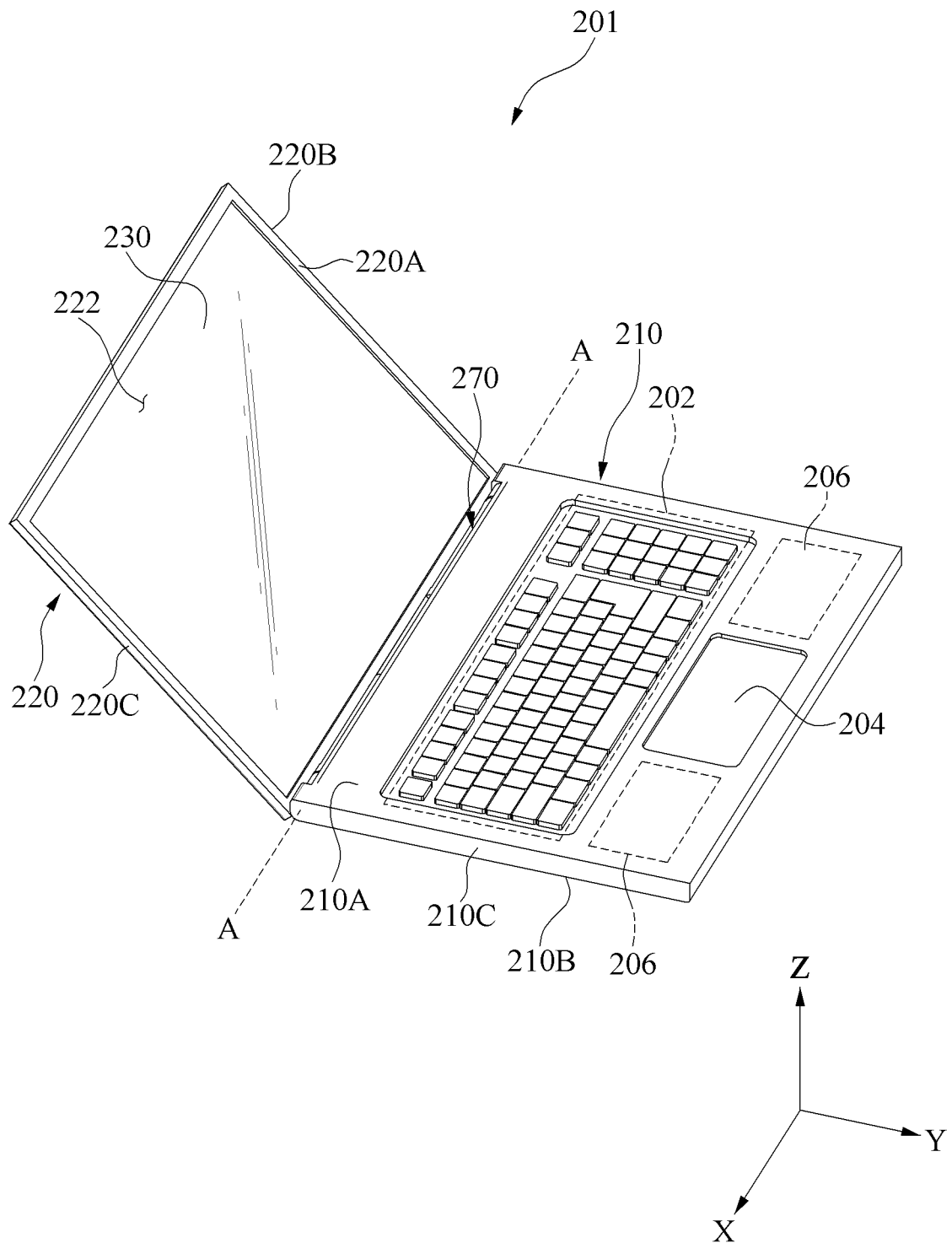
FIG. 2B is a perspective view illustrating an electronic device which is open according to an embodiment.

FIG. 2A is a perspective view illustrating an electronic device which is closed according to an embodiment, and FIG. 2B is a perspective view illustrating an electronic device according to an embodiment.

Referring to FIGS. 2A and 2B, an electronic device 201 (e.g., the electronic device 101 of FIG. 1) according to one embodiment may include a first housing 210, a second housing 220, a display 230, and a hinge assembly. The electronic device 201 may be, for example, a laptop computer, a tablet personal computer (PC), an e-book reader, a portable multimedia device, a portable medical device, a mobile terminal, or a home appliance.

In one embodiment, the first housing 210 and the second housing 220 may form an exterior of the electronic device 201. In one embodiment, the first housing 210 may include a first surface 210A, a second surface 210B facing a direction opposite to the first surface 210A, and a first side surface 210C surrounding a space between the first surface 210A and the second surface 210B. The second housing 220 may include a third surface 220A, a fourth surface 220B facing a direction opposite to the third surface 220A, and a second side surface 220C surrounding a space between the third surface 220A and the fourth surface 220B. In one embodiment, the third surface 220A of the second housing 220 may be formed in a position facing the first surface 210A of the first housing 210 of the electronic device 201 in the first state (e.g., a folded state of FIG. 2A).

In one embodiment, the first housing 210 and the second housing 220 may be connected to be relatively rotatable about a rotation axis A. For example, the first housing 210 and the second housing 220 may be rotatably connected via a hinge structure 270. In one embodiment, a state of the electronic device 201 may change via a relative rotation of the first housing 210 and the second housing 220 about the rotation axis A. For example, a state of the electronic device 201 may change between a first state in which the electronic device 201 is folded as shown in FIG. 2A and a second state in which the electronic device 201 is fully unfolded as shown in FIG. 2B, via a relative rotation of the first housing 210 and the second housing 220. In one embodiment, the first housing 210 and the second housing 220 may be substantially symmetrically disposed relative to the rotation axis A. In one embodiment, an angle and a relative distance formed by the first housing 210 and the second housing 220 may change according to a state of the electronic device 201. In one embodiment, the first housing 210 and the second housing 220 may be formed to be substantially symmetrical to each other in shape and size.

Figure 6A:
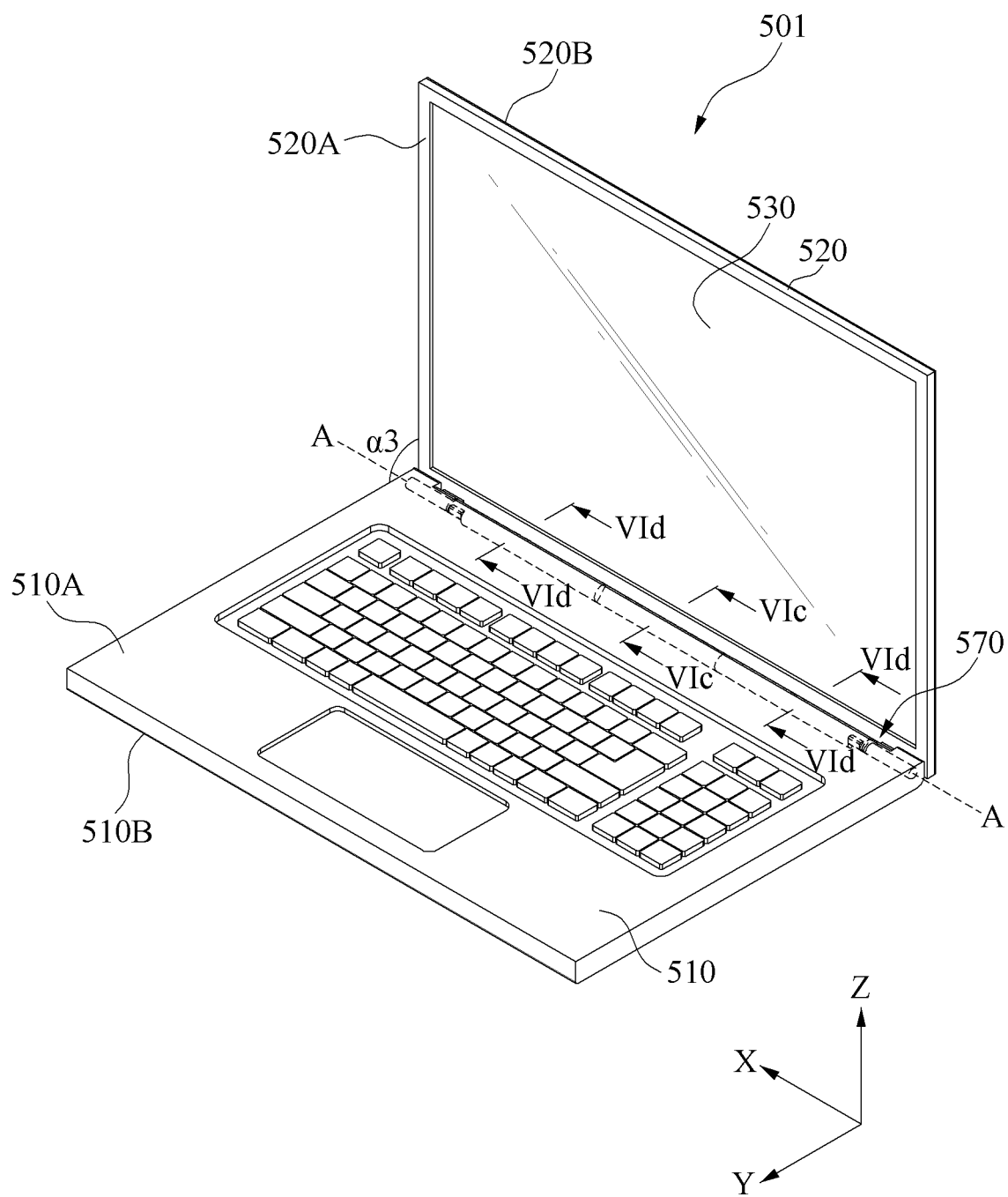
FIG. 6A is a perspective view illustrating an electronic device which is open according to one embodiment.

In one embodiment, an angle formed by the first surface 210A of the first housing 210 and the third surface 220A of the second housing 220 may change according to a state of the electronic device 201. In one embodiment, in the first state (e.g., the folded state) of the electronic device 201 in which the first surface 210A and the third surface 220A substantially face each other as shown in FIG. 2A, the first surface 210A and the third surface 220A may form a first angle substantially close to 0 degrees. For example, the first angle may range from 0 degrees to approximately 5 degrees. In one embodiment, in the second state (e.g., the unfolded state) in which the first surface 210A and the third surface 220A are fully unfolded as shown in FIG. 2B, the first surface 210A and the third surface 220A may form a second angle corresponding to a set maximum angle. For example, the second angle may be a set angle in a range of approximately 120 degrees to 180 degrees. In one embodiment, the first surface 210A and the third surface 220A may form an angle between the first angle and the second angle according to a state of the electronic device 201, for example, a relative rotation of the first housing 210 and the second housing 220. For example, when the electronic device 201 forms a third state as shown in FIG. 6A, the first surface 210A and the third surface 220A may form a third angle positioned between the first angle and the second angle. The third angle may be, for example, a set angle in a range of approximately 90 degrees to 120 degrees. However, the third angle is an arbitrary angle set for an operation of the hinge structure 270 to be described later, and an angle to be formed between the first surface 210A and the third surface 220A by the electronic device 201 is not limited thereto. In other words, the angle formed by the first surface 210A and the third surface 220A may be adjusted to form an arbitrary angle between the first angle corresponding to a minimum angle and the second angle corresponding to a maximum angle, according to a use state of the electronic device 201.

In one embodiment, a keyboard 202, a touchpad 204, and a palm rest 206 may be disposed on the first surface 210A of the first housing 210. The keyboard 202 (e.g., the input module 150 of FIG. 1) may include a plurality of keys disposed on the first surface 210A of the first housing 210. The keyboard 202 may receive numeric or character information from a user. The keyboard 202 may include a plurality of input keys and function keys for setting various functions of the electronic device 201. For example, the function keys may include an arrow key, a volume key, and/or a shortcut key set to perform a designated function. The keyboard 202 may include one of a query keypad, a 3*4 keypad, a 4*3 keypad, or a touch key. The touch pad 204 may receive user manipulation information. For example, the touchpad 204 may replace a function of a mouse. The touchpad 204 may receive a command to select or execute an application displayed on the display 230. The palm rest 206 may be a pedestal for reducing wrist fatigue of a user of the electronic device 201 when the user is using the keyboard 202.

In one embodiment, the display 230 may display visual information to the outside. The display 230 may be visually exposed to the outside by being disposed on the third surface 220A of the second housing 220. For example, a concave portion 222 may be formed on the third surface 220A, and the display 230 may be disposed to be seated on the concave portion 222. In one embodiment, the display 230 may be covered so as not to be exposed to the outside by the first surface 210A in the first state (e.g., the folded state of FIG. 2A) of the electronic device 201. In one embodiment, the display 230 may be formed of at least one of a liquid crystal display (LCD), an organic light-emitting diode (OLED), an active-matrix organic light-emitting diode (AMOLED), a flexible display 230, or a transparent display 230. Although in the drawings, the display 230 is illustrated as being disposed on the third surface 220A of the second housing 220, this is only an example, and a position in which the display 230 is arranged relative to the electronic device 201 is not limited thereto. As an example, the display 230 may be disposed to extend from the third surface 220A to the first surface 210A, and as another example, the electronic device 201 may include an auxiliary display disposed on a surface (e.g., at least one of the first surface 210A, the second surface 210B, or the fourth surface 220B) other than the third surface 220A.

In one embodiment, the hinge structure 270 may be disposed along the rotation axis A and may rotatably connect the first housing 210 and the second housing 220. In one embodiment, the hinge structure 270 may allow the first housing 210 and the second housing 220 to relatively rotate such that the electronic device 201 may change in state between the first state (e.g., the folded state of FIG. 2A) in which an angle between the first surface 210A and the third surface 220A forms the first angle and the second state (e.g., a maximumly open state of FIG. 2B) in which an angle between the first surface 210A and the third surface 220A forms the second angle. Hereinafter, for ease of description, the relative rotation of the first housing 210 and the second housing 220 about the rotation axis A is described based on the assumption that the second housing 220 is rotating relative to the first housing 210.

Figure 3A:
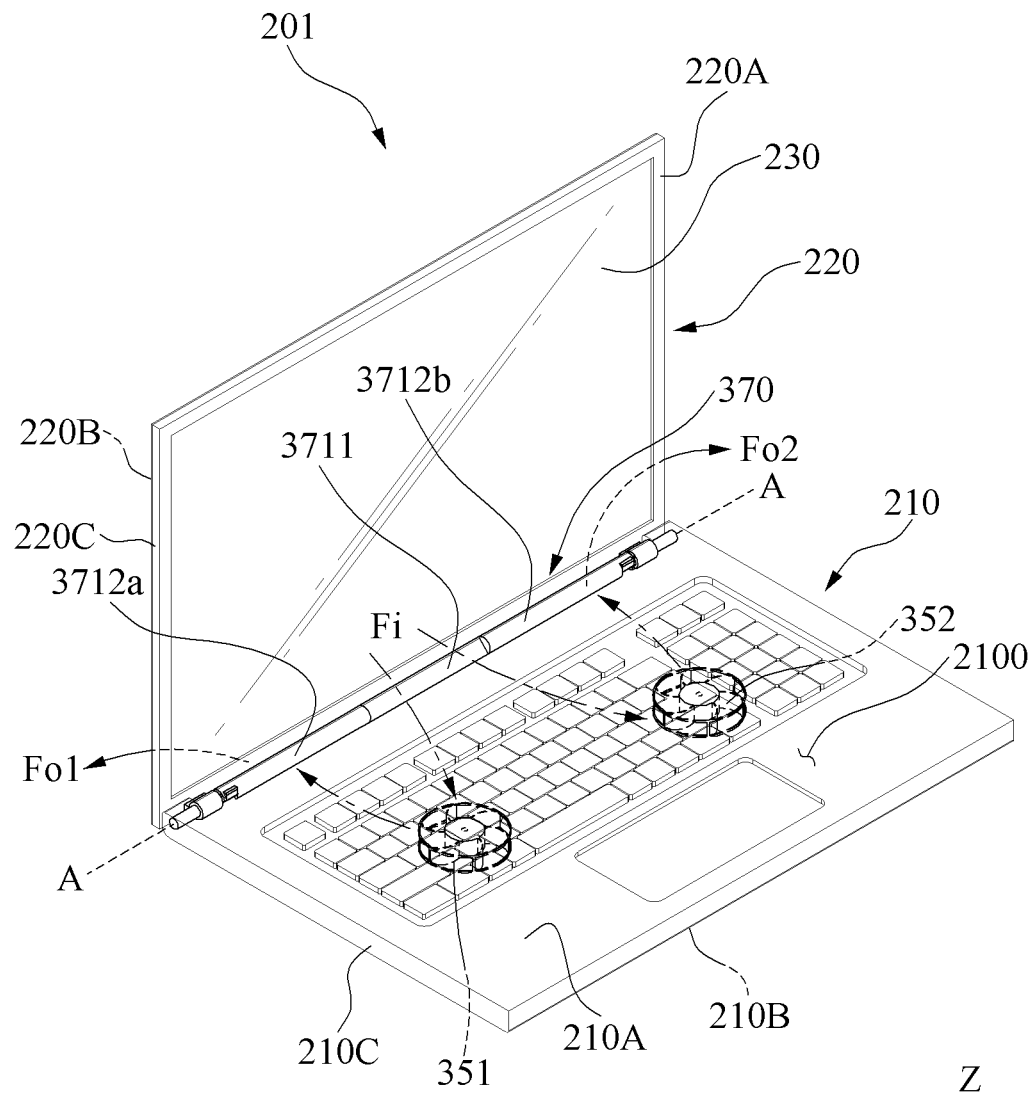
FIG. 3A is a diagram illustrating an air flow according to an operation of a fan component in an electronic device according to an embodiment.
Figure 3B:
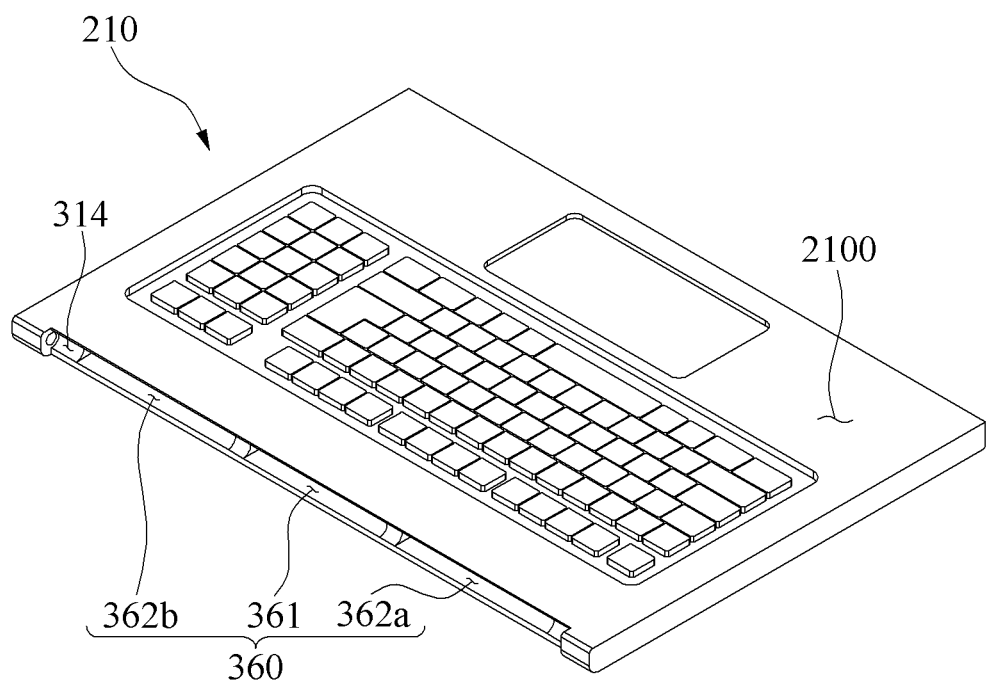
FIG. 3B is a perspective view of a first housing according to an embodiment.
Figure 3C:
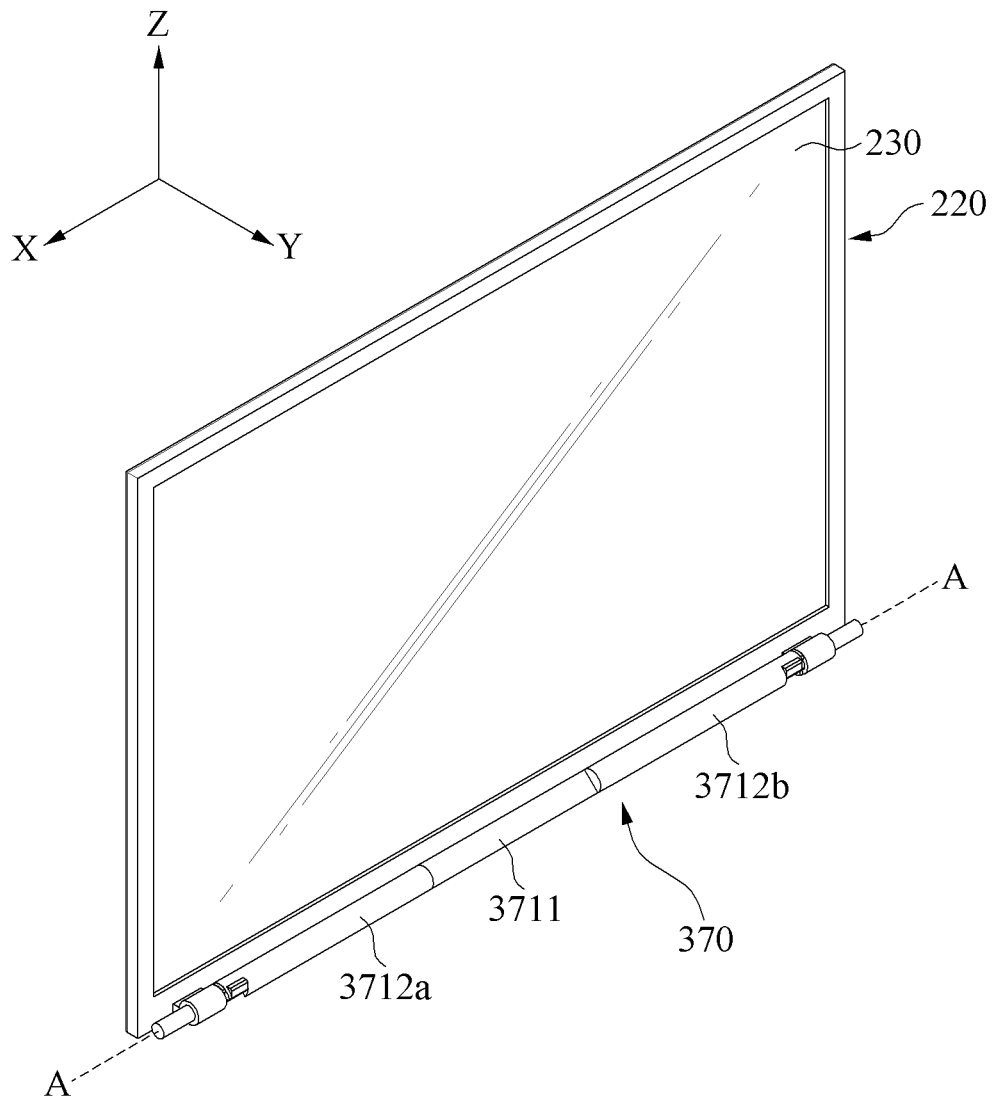
FIG. 3C is a perspective view of a second housing according to an embodiment.

FIG. 3A is a diagram illustrating an air flow according to an operation of a fan component in an electronic device according to an embodiment, FIG. 3B is a perspective view of a first housing according to an embodiment, and FIG. 3C is a perspective view of a second housing according to an embodiment.

Referring to FIGS. 3A to 3C, the electronic device 201 (e.g., the electronic device 101 of FIG. 1) according to one embodiment may include the first housing 210, the second housing 220, the display 230, and heat dissipation structures 350 and 360.

In one embodiment, the first housing 210 may include the first surface 210A, the second surface 210B opposite to the first surface 210A, and the first side surface 210C surrounding a space between the first surface 210A and the second surface 210B. In one embodiment, when the electronic device 201 is being used, the first housing 210 may be disposed in a state in which the second surface 210B faces a support surface of another structure, for example, a support surface of a structure such as a desk. In one embodiment, the second housing 220 may be rotatably connected to the first housing 210 at the rotation axis A. The second housing 220 may include the third surface 220A formed to face the first surface 210A in the first state (e.g., the folded state of FIG. 2A), the fourth surface 220B opposite to the third surface 220A, and the second side surface 220C surrounding a space between the third surface 220A and the fourth surface 220B. In one embodiment, the display 230 may be disposed to be visually exposed on the third surface 220A of the second housing 220.

In one embodiment, the first housing 210 may include a first space 2100 formed inside the first housing 210 (e.g., an inner space). Various components (e.g., a battery, a PCB, and the like) for performing a function of the electronic device 201 may be disposed in the first space 2100. In one embodiment, the first housing 210 may include heat dissipation structures 350 and 360 for controlling a temperature of components disposed in the first space 2100. For example, the first housing 210 may include an opening 360 through which the first space 2100 communicates with the outside, and one or more fan component 350 disposed in the first space 2100 and flowing air through the opening 360.

In one embodiment, the opening 360 may allow air to pass between the first space 2100 and the outside by opening at least a portion of the first housing 210. In one embodiment, at least a portion of the opening 360 may be formed on a side surface of the first housing 210. For example, the opening 360 may be formed in a side portion of the first housing 210 facing the hinge structure 370 as shown in FIG. 3A and FIG. 3B. In one embodiment, the opening 360 may include one or more intake portion 361 (e.g., an intake opening) through which air is sucked into the first space 2100 from the outside, and one or more of exhaust portions 362*a* and 362*b* (e.g., an exhaust opening) through which air is discharged from the first space 2100 to the outside. For example, the opening 360 may include one intake portion 361 (e.g., an intake opening) positioned at a central portion relative to a direction of the rotation axis A, a first exhaust portion 362*a* (e.g., a first exhaust opening) disposed on a right side (e.g., a +X-axial direction) of the intake portion 361, and a second exhaust portion 362*b* (e.g., a second exhaust opening) disposed on a left side (e.g., a −X-axial direction) of the intake portion 361, as shown in FIG. 3A and FIG. 3B. In one embodiment, the intake portion 361 and the exhaust portions 362a and 362b may be formed separately from each other as shown in FIG. 3A and FIG. 3B so that the air passing therethrough is not mixed in the air flow process. Meanwhile, the shape, number, and relative arrangement position of each of the intake portion 361 and the exhaust portions 362a and 362b of the opening 360 shown in the drawings are only examples, and are not limited to those of the embodiments illustrated in the drawings. For example, the opening 360 may include one of an intake portion and an exhaust portion, or may include a plurality of intake portions and exhaust portions.

Figure 8A:
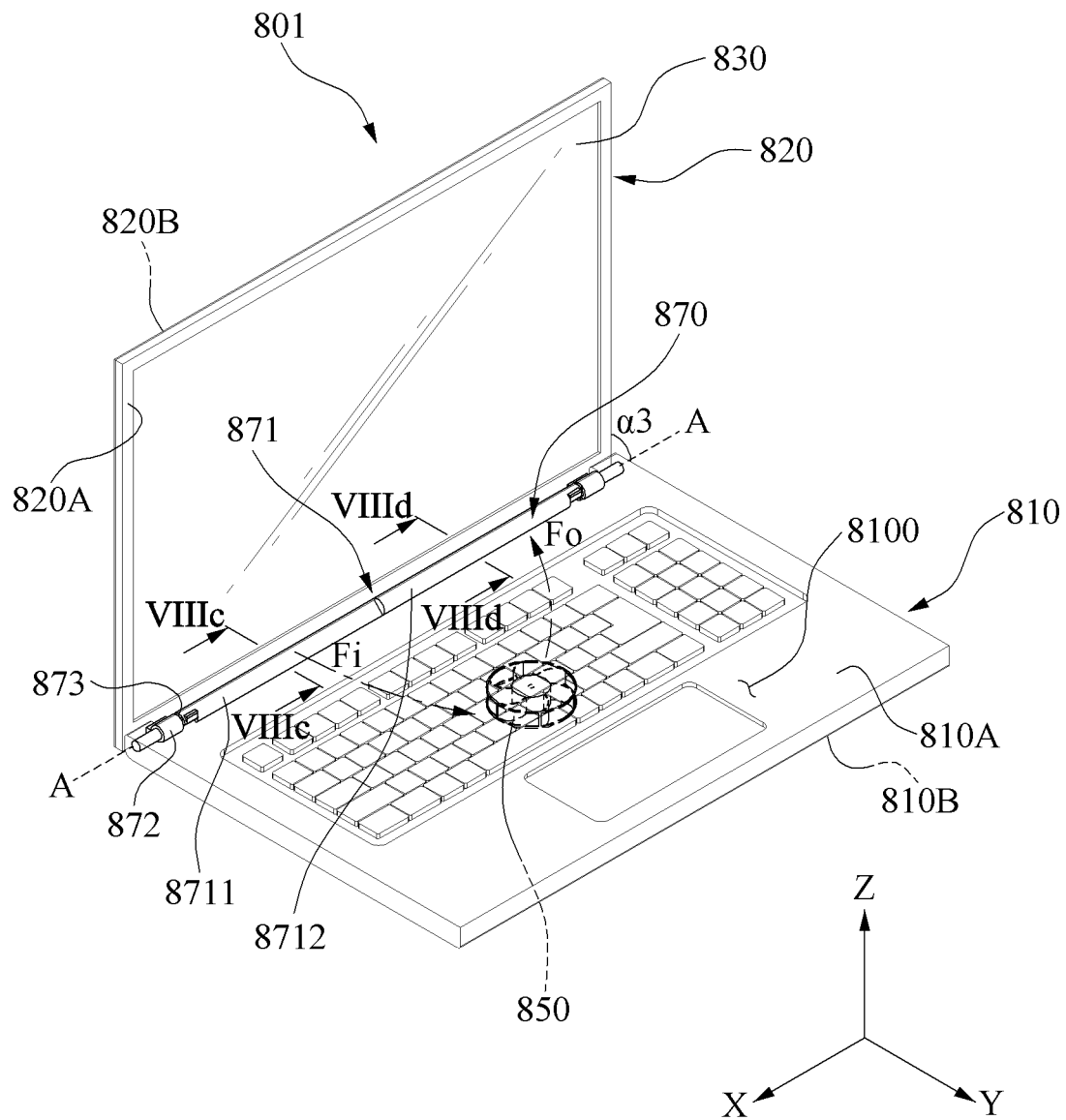
FIG. 8A is a perspective view illustrating an air flow according to an operation of a fan component in an electronic device which is open according to an embodiment.
Figure 9A:
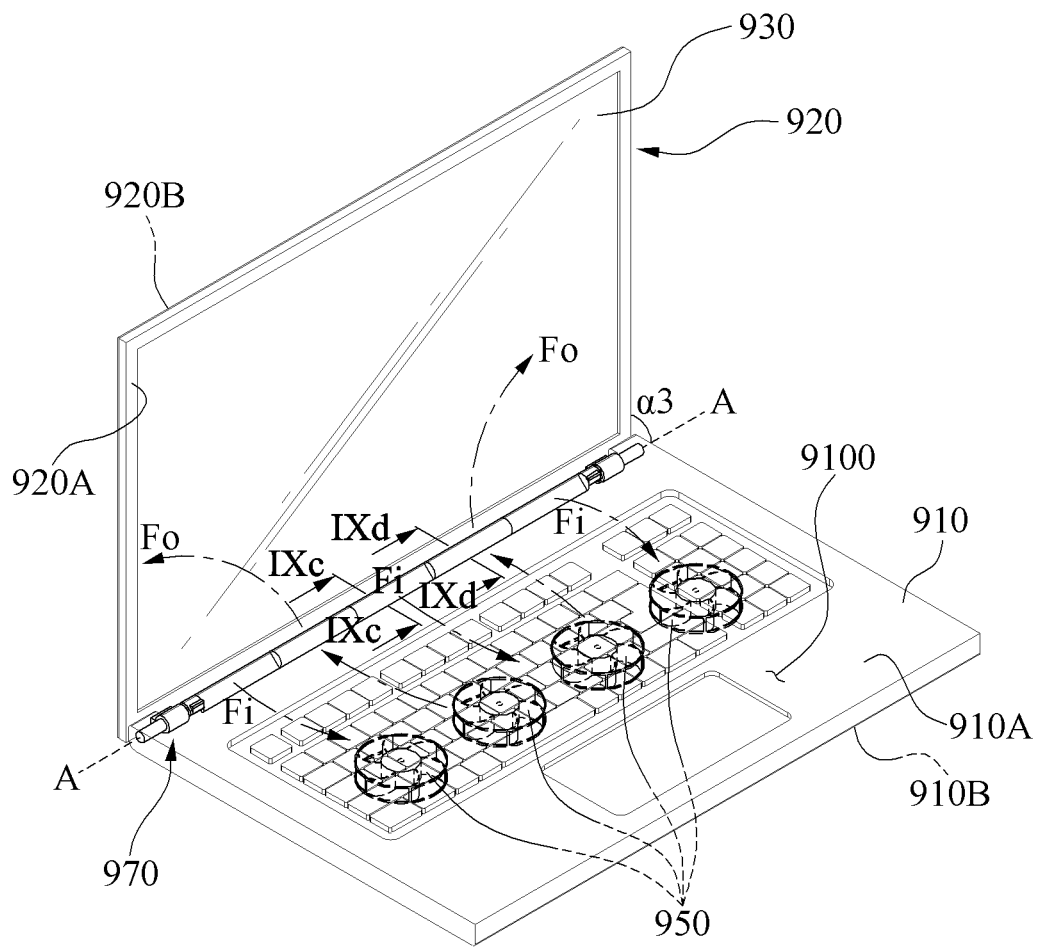
FIG. 9A is a perspective view illustrating an air flow according to an operation of a fan component in an electronic device in a third state according to an embodiment.

In one embodiment, one or more fan component 350 may be disposed in the first space 2100 and may circulate air between the first space 2100 and the outside through the opening 360. That is, the first space 2100 may be connected to (e.g., in fluid or air communication) with the outside of the electronic device 201, such that air flow may be defined therebetween. In one embodiment, according to an operation of the fan component 350, the fan component 350 may generate air pressure to circulate air between the first space 2100 and the outside, and adjust a temperature of the first space 2100 according to the circulation of the air. In one embodiment, according to an operation of the fan component 350, external air may flow into the first space 2100 through the intake portion 361 and absorb heat generated in the first space 2100, and then be discharged from the first space 2100 to the outside through the exhaust portions 362a and 362b. That is, the intake opening and the exhaust opening of the housing may be connected to (e.g., in fluid or air communication) with both the inner space of the housing and the outside of the housing). In one embodiment, the fan component 350 may be disposed in the first space 2100 to effectively radiate heat through the opening 360. For example, when the opening 360 includes one intake portion 361 and a pair of exhaust portions 362a and 362b positioned on opposite sides of the intake portion 361 as shown in FIG. 3A, a pair of fan components 351 and 352 for discharging air through each of the exhaust portions 362a and 362b may be disposed in the first space 2100. The fan component 350 may include a first fan component 351 disposed in the first space 2100 to be adjacent to the first exhaust portion 362a relative to the direction of the rotation axis A, and a second fan component 352 disposed in a second space to be adjacent to the second exhaust portion 362b relative to the direction of the rotation axis A. In this case, the first fan component 351 may circulate a part of the air Fi sucked into the first space 2100 through the intake part 361 in a left direction (e.g., a +X-axial direction) of the first housing 210 and discharge Fo1 through the first exhaust portion 362a, and the second fan component 352 may circulate a part of the air Fi sucked into the first space 2100 in a right direction (e.g., a −X-axial direction) of the first housing 210 and discharge Fo2 through the second exhaust portions 362a and 362b. Meanwhile, the number and arrangement position of the fan component 350 shown in the drawings are only examples and are not limited thereto. For example, as shown in FIG. 8A, one fan component 850 may be disposed in a first space 8100 to circulate air, and as shown in FIG. 9A, a plurality of fan components 950 may be disposed in a first space 9100 to circulate air in different directions.

In one embodiment, the hinge structure 370 may rotatably connect the first housing 210 and the second housing 220. The hinge structure 370 may be disposed along the rotation axis A, and may rotate about the rotation axis A according to a rotation of the second housing 220 relative to the first housing 210. In one embodiment, the hinge structure 370 may be disposed at a position facing the opening 360 formed in the first housing 210. In one embodiment, at least a portion of the hinge structure 370 may be fixed to the second housing 220 and be rotatably connected to the first housing 210. For example, the hinge structure 370 may be fixed to the third surface 220A of the second housing 220 as shown in FIG. 3A, and an end of the hinge structure 370 may be rotatably connected to the first housing 210. In this case, a seating space 314 that is concave inward may be formed in the side surface 210C of the first housing 210 such that the hinge structure 370 may be rotatably inserted therein. The opening 360 may be formed on an inner circumferential surface of the seating space 314 in the direction of the rotation axis A.

In one embodiment, the hinge structure 370 may include a vent member 371 for guiding a flow direction of air through the opening 360. The vent member 371 may include a first vent portion 3711 (e.g., a first air flow guide portion) for guiding the air flow between the intake portion 361 and the outside, and a second vent portion 3712 (e.g., a second air flow guide portion) for guiding the air flow between the exhaust portions 362a and 362b and the outside. In one embodiment, the vent member 371 may be disposed at a position facing the opening 360. In this case, the first vent portion 3711 may be formed in a portion of the vent member 371 facing the intake portion 361, and the second vent portion 3712 may be formed in a portion of the vent member 371 facing the exhaust portions 362a and 362b. In one embodiment, the first vent portion 3711 and the second vent portion 3712 may be formed in positions and shapes corresponding to the intake portion 361 and the exhaust portions 362a and 362b of the opening 360. For example, as shown in FIG. 3C, the intake portion 361 may be formed on a central portion of the opening 360 along the direction of the rotation axis A, and when a pair of exhaust portions 362a and 362b are formed on opposite sides of the intake portion 361, the first vent portion 3711 may be formed on a central portion of the vent member 371 corresponding to the intake portion 361, and a pair of second vent portions 3712a and 3712b may be formed on opposite side portions of the vent member 371 corresponding to the pair of exhaust portions 362a and 362b.

In one embodiment, the first vent portion 371 and the second vent portion 372 may guide a flow of air in different directions. For example, in the third state as shown in FIG. 3A, the first vent portion 371 of the vent member 371 may guide air from the first surface 210A and the third surface 220A (e.g., at a front surface of the open electronic device) to the intake portion 361, and the second vent portion 372 may guide air to be discharged between the second surface 210B and the fourth surface 220B (e.g., at a rear surface of the open electronic device) from the exhaust portions 362a and 362b. In this case, based on the direction of the rotation axis A, the first vent portion 371 may be formed longitudinally covering the intake portion 361, and each of the second vent portions 3712a and 3712b may be formed longitudinally covering each of the corresponding exhaust portions 362a and 362b formed at a position of the opening 360.

Figure 4A:
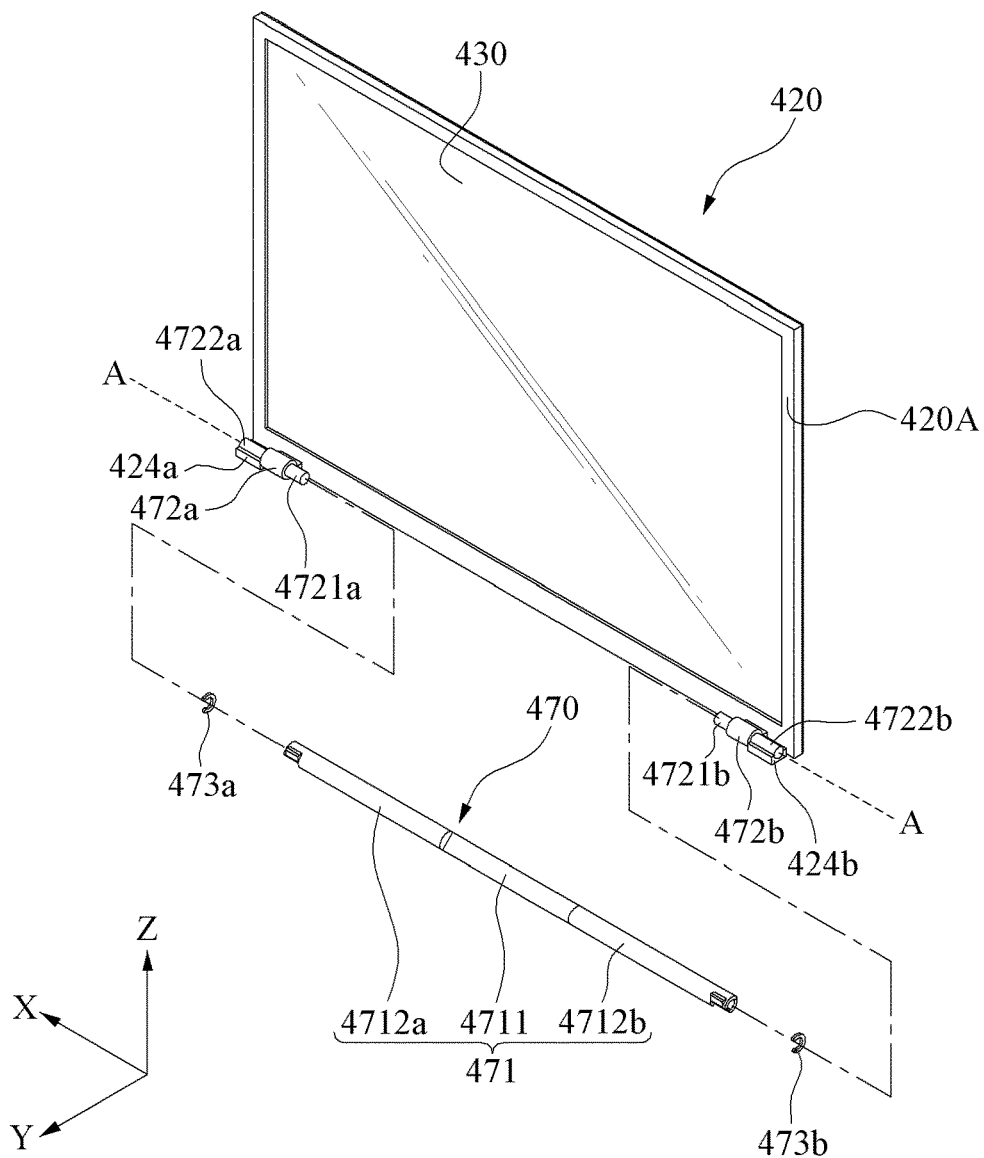
FIG. 4A is an exploded perspective view of a hinge structure according to an embodiment.
Figure 4B:
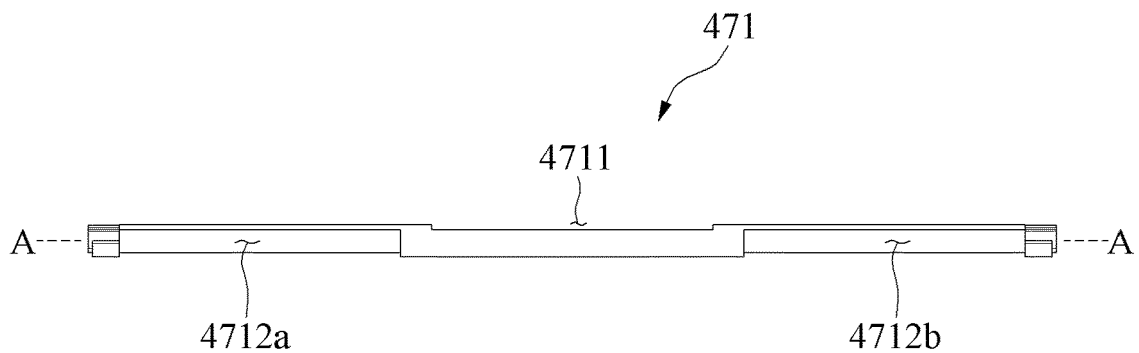
FIG. 4B is a front view.
Figure 4C:
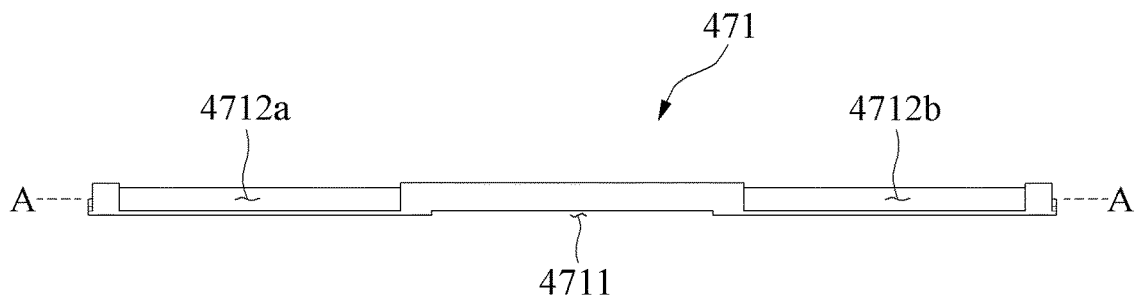
FIG. 4C is a rear view.
Figure 4D:
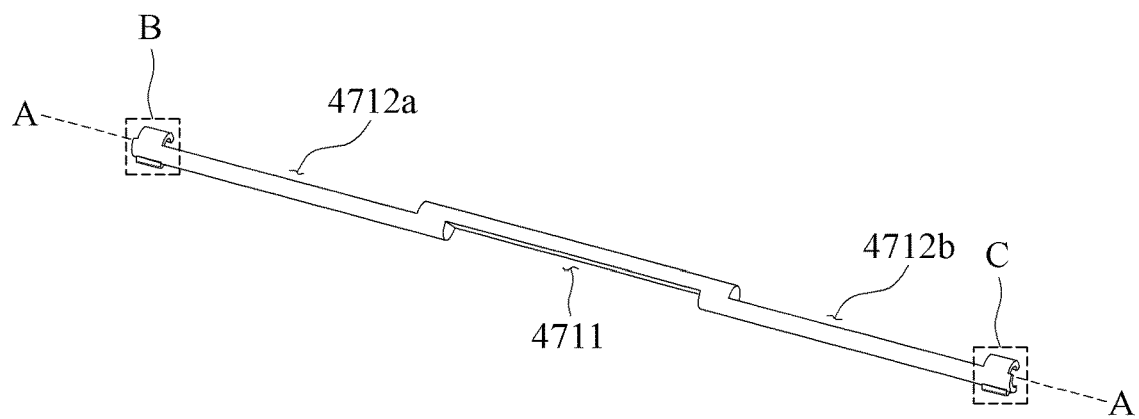
FIG. 4D is a perspective view.
Figure 4E:
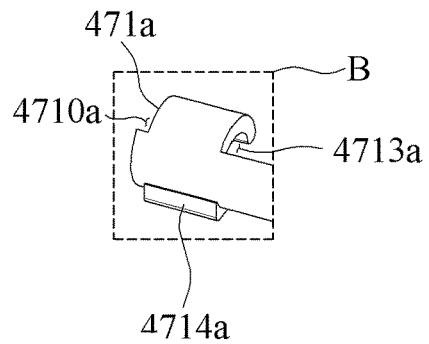
FIGS. 4E and 4F are enlarged perspective views, of a vent member according to an embodiment.
Figure 4F:
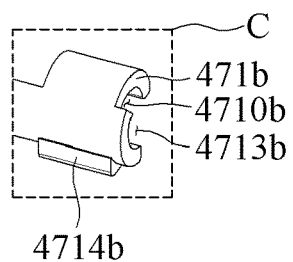
Figure 4G:
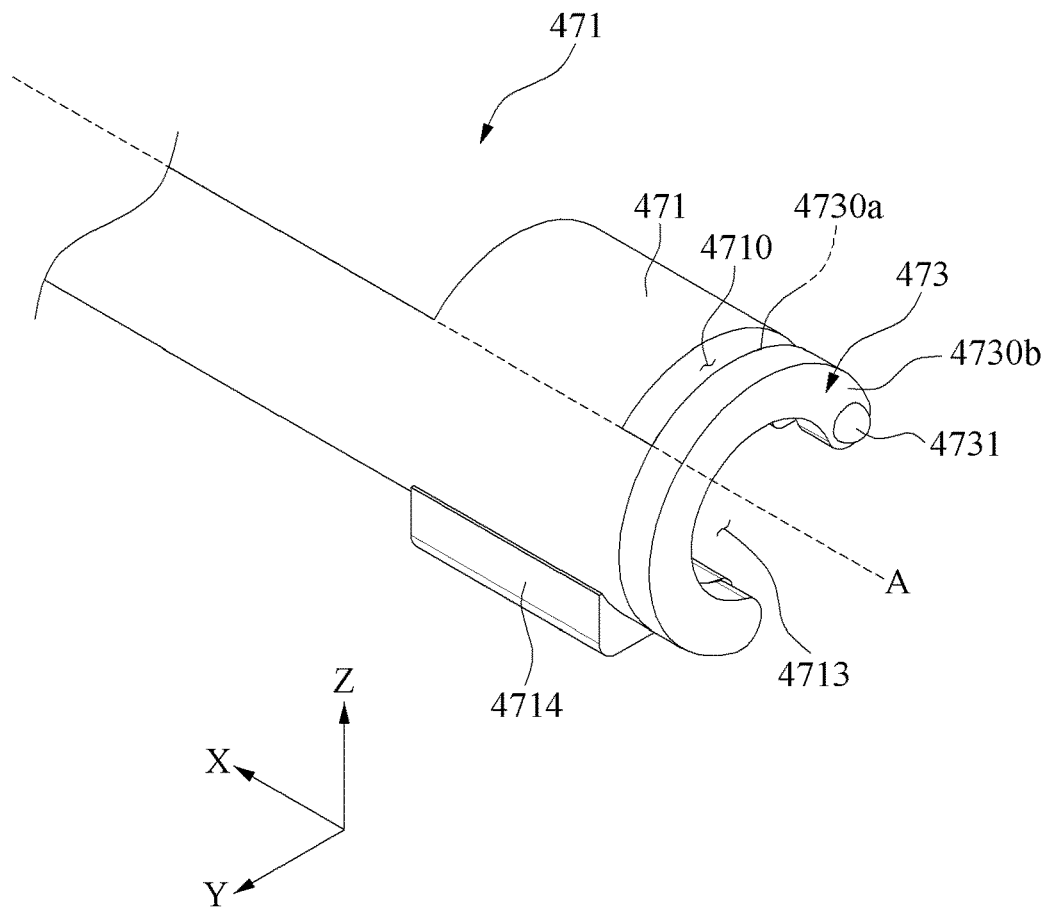
FIG. 4G is a perspective view illustrating a connection relationship between a vent member and a connecting member according to an embodiment.
Figure 4H:
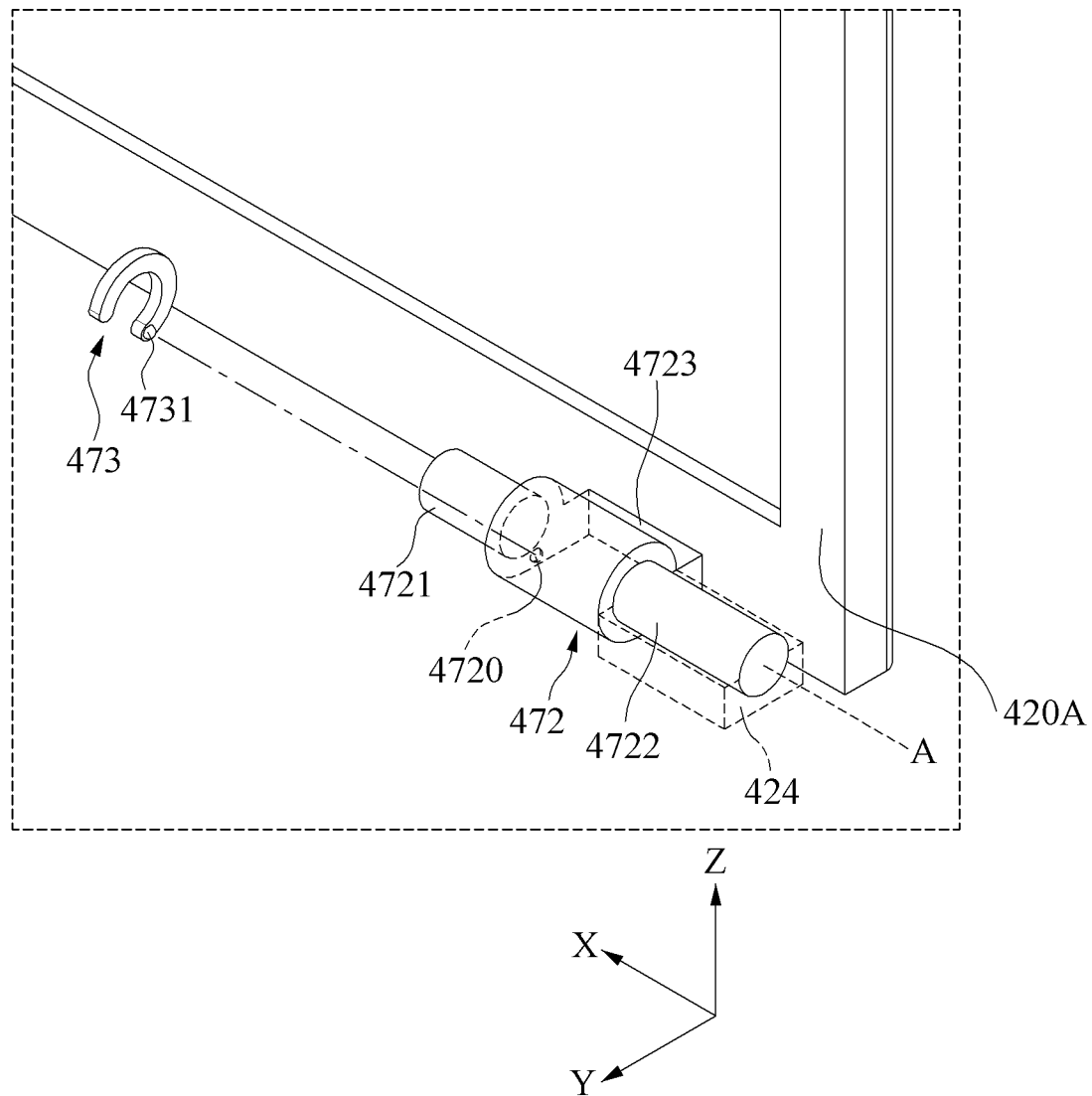
FIG. 4H is a perspective view illustrating a connection relationship between a connecting member and a rotating member according to an embodiment.

FIG. 4A is an exploded perspective view of a hinge structure according to an embodiment, FIG. 4B is front view, FIG. 4C is a rear view, FIG. 4D is a perspective view, and FIGS. 4E and 4F are enlarged perspective views of a vent member according to an embodiment, FIG. 4G is a perspective view illustrating a connection relationship between a vent member and a connecting member according to one embodiment, and FIG. 4H is a perspective view illustrating a connection relationship between a connecting member and a rotating member according to an embodiment. FIGS. 4E and 4F are enlarged perspective views of region B and C in FIG. 4D, respectively.

Referring to FIGS. 4A to 4H, a hinge structure 470 according to one embodiment may be connected to a second housing 420. For example, the hinge structure 470 may be disposed on a third surface 420A of the second housing 420 on which a display 430 is disposed.

The hinge structure 470 according to one embodiment may include a vent member 471, a rotating member 472, and a connecting member 473.

In one embodiment, the vent member 471 may extend longitudinally in a direction of a rotation axis A (e.g., an X-axial direction). In one embodiment, the vent member 471 may include a first vent portion 4711 and a second vent portion 4712 formed to extend in the longitudinal direction. For example, the vent member 471 may include the first vent portion 4711 formed longitudinally on a central portion, and a pair of second vent portions 4712a and 4712b formed on opposite sides of the first vent portion 4711, respectively. In one embodiment, based on the longitudinal direction of the vent member 471, the first vent portion 4711 and the second vent portion 4712 may be formed in a position and length corresponding to the intake portion 361 and the exhaust portions 362a and 362b of the opening 360 formed in the first housing 210 as shown in FIG. 3C. In one embodiment, the vent member 471 may have a substantially circular cross-sectional shape when viewed in the direction of the rotation axis A. In one embodiment, based on a cross-section of the vent member 471 perpendicular to the rotation axis A, the first vent portion 4711 and the second vent portion 4712 may be formed such that at least a portion of an outer surface of the vent member 471 is concave to allow air to pass therethrough. In this case, based on the cross-section of the vent member 471 perpendicular to the rotation axis A as shown in FIG. 4B, a first vent portion 4711 and a second vent portion 4712 may be formed such that the outer surface of the vent member 471 is concave in different directions.

In one embodiment, the vent member 471 may guide a flow direction of air passing through an opening (e.g., the opening 360 of FIG. 3B). For example, the vent member 471 may pass air through the first vent portion 4711 and the second vent portion 4712 having a concave outer surface, and thereby guide the flow direction of air between a first space (e.g., the first space 2100 of FIG. 3A) inside the first housing and the outside. In one embodiment, the first vent portion 4711 may guide the flow direction of air introduced into a first space (e.g., the first space 2100 of FIG. 3B) from the outside through an intake portion (e.g., the intake portion 361 of FIG. 3B), and the second vent portion 4712 may guide the flow direction of air discharged from the first space (e.g., the first space 2100 of FIG. 3B) to the outside through an exhaust portion (e.g., the exhaust portions 362a and 362b of FIG. 3B). In one embodiment, since the first vent portion 4711 and the second vent portion 4712 are formed in different directions relative to the cross-section of the vent member 471 perpendicular to the rotation axis A, the flow directions of air passing through the first vent portion 4711 and the second vent portion 4712 may be different.

In one embodiment, the vent member 471 may rotate about the rotation axis A according to an operation of the hinge structure 470. In this case, the vent member 471 may rotate according to a rotation of the hinge structure 470 only in a set angle range. For example, when a state of an electronic device is changed between a first state (e.g., a first state of an electronic device 501 of FIG. 5A) and a second state (e.g., a second state of the electronic device 501 of FIG. 7A), the vent member 471 may only rotate between a first state (e.g., the first state of the electronic device 501 of FIG. 5A) in which a first housing (e.g., a first housing 510 of FIG. 5A) and the second housing 420 (e.g., a second housing 520 of FIG. 5A) form a first angle, and a third state (e.g., a third state of the electronic device 501 of FIG. 6A) in which a first housing and a second housing form a set third angle. In this case, when a state of the electronic device is changed from the third state and the second state, a rotation angle of the vent member 471 relative to the rotation axis A may be maintained in a stopped state. Accordingly, when an angle of the second housing relative to the first housing is changed between the set third angle and the second angle, the flow direction of air passing through the vent member 471 may be kept constant relative to the first housing. A further description thereof will be provided later.

In one embodiment, the vent member 471 may include a stopper 4714. The stopper 4714 may limit rotation of the vent member 471 about the rotation axis A so that the vent member 471 may rotate only in a set angle range. For example, when a state of the electronic device is being changed between the first state (e.g., the first state of the electronic device 501 of FIG. 5A) and the second state (e.g., the second state of the electronic device 501 of FIG. 7A), the stopper 4714 may allow the vent member 471 to rotate about the rotation axis A between the first state and the third state, and not allow the vent member 471 to rotate about the rotation axis A between the third state and the second state. In one embodiment, the stopper 4714 may be connected to an outer surface of the vent member 471. For example, the stopper 4714 may be formed to protrude from the outer surface of the vent member 471. In one embodiment, the stopper 4714 may restrict rotation of the vent member 471 in one direction (e.g., a direction of rotation from the third state to the second state according to an operation of the electronic device) by being in contact with another member, for example, an end of the first housing (e.g., the first housing 510 of FIG. 5A) in the third state of the electronic device. In one embodiment, the vent member 471 may include one or more stopper 4714. For example, the vent member 471 may include a pair of stoppers 4714a and 4714b formed at opposite ends in a longitudinal direction.

In one embodiment, the rotating member 472 may connect a first housing (e.g., the first housing 210 of FIG. 3A) and the second housing 420. In one embodiment, at least a portion of the rotating member 472 may be fixed to the second housing 420 and be rotatably connected to the first housing along the rotation axis A. For example, the rotating member 472 may include a fixing portion 4723 having a surface connected to the second housing 420. The fixing portion 4723 may be connected to the third surface 420A of the second housing 420. In one embodiment, the rotating member 472 may include a rotating portion 4722 rotatably connected to the first housing 410. The rotating portion 4722 may be formed to protrude in the direction of the rotation axis A opposite to the vent member 471. For example, a first rotating member 472a may include a first rotating portion 4722a protruding in a +X-axial direction, and a second rotating member 472b may include a second rotating portion 4722b protruding in a −X-axial direction. In one embodiment, a fixing member 424 into which the rotating portion 4722 of the rotating member 472 is rotatably inserted may be formed in the first housing 420. In one embodiment, a first fixing member 424a into which the first rotating portion 4722a of the first rotating member 472a is inserted, and a second fixing member 424b into which the second rotating portion 4722b of the second rotating member 472b is inserted may be formed in the first housing 420. In one embodiment, the rotating member 472 may rotate about the rotation axis A according to a rotation of the second housing relative to the first housing. For example, when a state of the electronic device is changed between the first state and the second state, the rotating member 472 rotates about the rotation axis A and an angle between the first housing and the second housing changes between the first angle and the second angle.

In one embodiment, the rotating member 472 may be connected to the vent member 471 along the direction of the rotation axis A. In one embodiment, the rotating member 472 may include the first rotating member 472*a* connected to a first end 471*a* (e.g., an end facing the +X-axial direction) of the vent member 471, and the second rotating member 472*b* connected to a second end 471*b* (e.g., an end facing the −X-axial direction) of the vent member 471, in the direction of the rotation axis A. In one embodiment, the rotating member 472 may include a connecting portion 4721 protruding in a direction of the vent member 471 along the direction of the rotation axis A, and the vent member 471 may include a connecting groove 4713 formed in the direction of the rotation axis A such that the connecting portion 4721 is inserted. For example, the vent member 471 may include a first connecting groove 4713*a* formed at the first end 471*a* in the direction of the rotation axis A, and a second connecting groove 4713*b* formed at the second end 471*b* in the direction of the rotation axis A. In this case, a first rotating member 472*a* may include a first connecting portion 4721*a* protruding in the direction of the rotation axis A so as to be insertable into the first connecting groove 4713*a*, and a second rotating member 472*b* may include a second connecting portion 4721*b* protruding in the direction of the rotation axis A so as to be insertable into the second connecting groove 4713*b*. The connecting portions 4721*a* and 4721*b* of each of the rotating members 472*a* and 472*b* may be respectively connected to opposite ends of the vent member 471 by being inserted into the connecting grooves 4713*a* and 4713*b*.

In one embodiment, the connecting member 473 may connect the vent member 471 and the rotating member 472. In one embodiment, the connecting member 473 may selectively transmit a rotational force of the rotating member 472 to the vent member 471 according to a state of the electronic device. For example, in the first and third states of the electronic device, the connecting member 473 may transmit a rotational force of the rotating member 472 to the vent member 471 so that the rotating member 472 and the vent member 471 may rotate integrally. During a change between the third state and the second state, the connecting member 473 may prevent transmission of the rotational force of the rotating member 472 to the vent member 471 so that the rotating member 472 may rotate independently of the vent member 471.

In one embodiment, the connecting member 473 may be disposed between the vent member 471 and the rotating member 472 in the direction of the rotation axis A. For example, the connecting member 473 may include a first connecting member 473*a* disposed between the first rotating member 472*a* and the vent member 471, and a second connecting member 473*b* disposed between the second rotating member 472*b* and the vent member 471. The connecting member 473 may include a first connecting surface 4730*a* facing the vent member 471 and a second connecting surface 4730*b* opposite to the first connecting surface 4730*a* and facing the rotating member 472.

In one embodiment, the connecting member 473 may be fixed to the vent member 471. For example, the connecting member 473 may have a first connecting surface 4730*a* attached to an end surface of the vent member 471 facing the rotating member 472. In one embodiment, a first connecting surface (e.g., a surface of the first connecting member 473*a* facing a +X direction in FIG. 4A) (not shown) of the first connecting member 473*a* may be attached to the first end 471*a* of the vent member 471, and the first connecting surface 4730*a* of the second connecting member 473*b* may be attached to the second end 471*b* of the vent member 471.

In one embodiment, the connecting member 473 may include a first fastening portion 4731 formed on the second connecting surface 4730*b*, and the rotating member 472 may include a second fastening portion 4720 formed at an end of the rotating member 472 facing the vent member 471, for example, an end of the rotating member 472 facing the second connecting surface 4730*b*. In one embodiment, the first fastening portion 4731 of the connecting member 473 may be selectively fastened to the second fastening portion 4720 of the rotating member 472 according to a state of the electronic device, that is, depending on whether the vent member 471 is rotatable. For example, in a state (e.g., a state between a first state of FIG. 5A and a third state of FIG. 6A) between the first and third states of the electronic device in which rotation of the vent member 471 is not restricted, the first fastening portion 4731 and the second fastening portion 4720 may be interlocked and fastened to each other, and in a state (e.g., a state between a third state of FIG. 6A and a second state of FIG. 7A) state) between the third state and the second state in which rotation of the vent member 471 is restricted, the first fastening portion 4731 and the second fastening portion 4720 may be separated from each other. In one embodiment, the connecting member 473 may transmit a rotational force of the rotating member 472 to the vent member 471 according to a fastening state of the first fastening portion 4731 and the second fastening portion 4720. For example, in a state in which the first fastening portion 4731 and the second fastening portion 4720 are fastened, the connecting member 473 may rotate according to the rotation of the rotating member 472 to rotate the vent member 471. On the other hand, in a state in which the first fastening portion 4731 and the second fastening portion 4720 are separated, the connecting member 473 may prevent transmission of a rotational force between the rotating member 472 and the vent member 471, and thereby allow the rotating member 472 to rotate independently in a state in which rotation of the vent member 471 is restricted.

In one embodiment, the connecting member 473 may be formed of an elastic material that is deformable in shape. The connecting member 473 may be selectively fastened to the rotating member 472 while being deformed in shape according to a rotation of the hinge structure 470. For example, the first fastening portion 4731 of the connecting member 473 may include a fastening protrusion protruding from the second connecting surface 4730*b* in the direction of the rotation axis A, and the second fastening portion 4720 may include a fastening groove recessed at an end so that the fastening protrusion may be inserted. In this case, a concave portion 4710 that is concave in a direction opposite to the connecting member 473 along the direction of the rotation axis A may be formed on an end surface of the vent member 471 to which the connecting member 473 is attached. For example, a first concave portion 4710*a* may be formed on the first end 471*a* of the vent member 471, and a second concave portion 4710*b* may be formed on the second end 471*b* of the vent member 471. In one embodiment, the concave portion 4710 may at least partially overlap with the first fastening portion 4731 of the connecting member 473 when viewed in the direction of the rotation axis A.

In one embodiment, when the state of the electronic device changes through operation from the first state to the second state (e.g., from the first state of FIG. 5A through the third state of FIG. 6A to the second state of FIG. 7A), from the first state to the third state (e.g., the first state of FIG. 5A to the third state of FIG. 6A), the first fastening portion 4731 of the connecting member 473 may be fastened to the second fastening portion 4720. In this case, when the state of the electronic device changes through operation from the third state in which rotation of the vent member 471 is restricted to the second state (e.g., the third state of FIG. 6A to the second state of FIG. 7A), the first fastening portion 4731 may be deformed to be pressed in a direction of the concave portion 4710 by a rotation of the rotating member 472 to be separated from the second fastening portion 4720. On the other hand, when the state of the electronic device changes through operation from the second state to the first state (e.g., when the electronic device 501 changes through operation from the second state of FIG. 7A to the first state of FIG. 5A), the first fastening portion 4731 of the connecting member 473 may be pressed in a direction of the concave portion 4710 by an end surface of the rotating member 472 to maintain a stopped state from the second state to the third state, and when the third state is reached, may be inserted into the second fastening portion 4720 and held by resistance. In this case, when the electronic device changes through operation from the third state to the first state, the connecting member 473 may be rotated by the vent member 471 in a state in which the first fastening portion 4731 is fastened to the second fastening portion 4720.

In one embodiment, the hinge structure 470 may rotate according to an operation of the electronic device, for example, a rotation of the second housing 420 relative to the first housing. At the same time, the hinge structure 470 may limit rotation of the vent member 471 in a set state range, thereby guiding a flow of air in a predetermined direction in the set state. For example, the hinge structure 470, by limiting the rotation of the vent member 471 between a third state (e.g., the third state of FIG. 6A) in which a third angle is formed by the first housing and the second housing 420 and a second state (e.g., the second state of FIG. 7A) in which a second angle is formed, may guide air from an intake to the first space and guide air exhausted from the first space at a predetermined angle relative to a surface (e.g., a surface on which a second surface of the first housing is supported) in a state where the first housing and the second housing 420 are separated by a third angle or more.

Hereinafter, an operation of the hinge structure according to a state of the electronic device according to one embodiment is described with reference to FIGS. 5A to 7D.

Figure 5A:
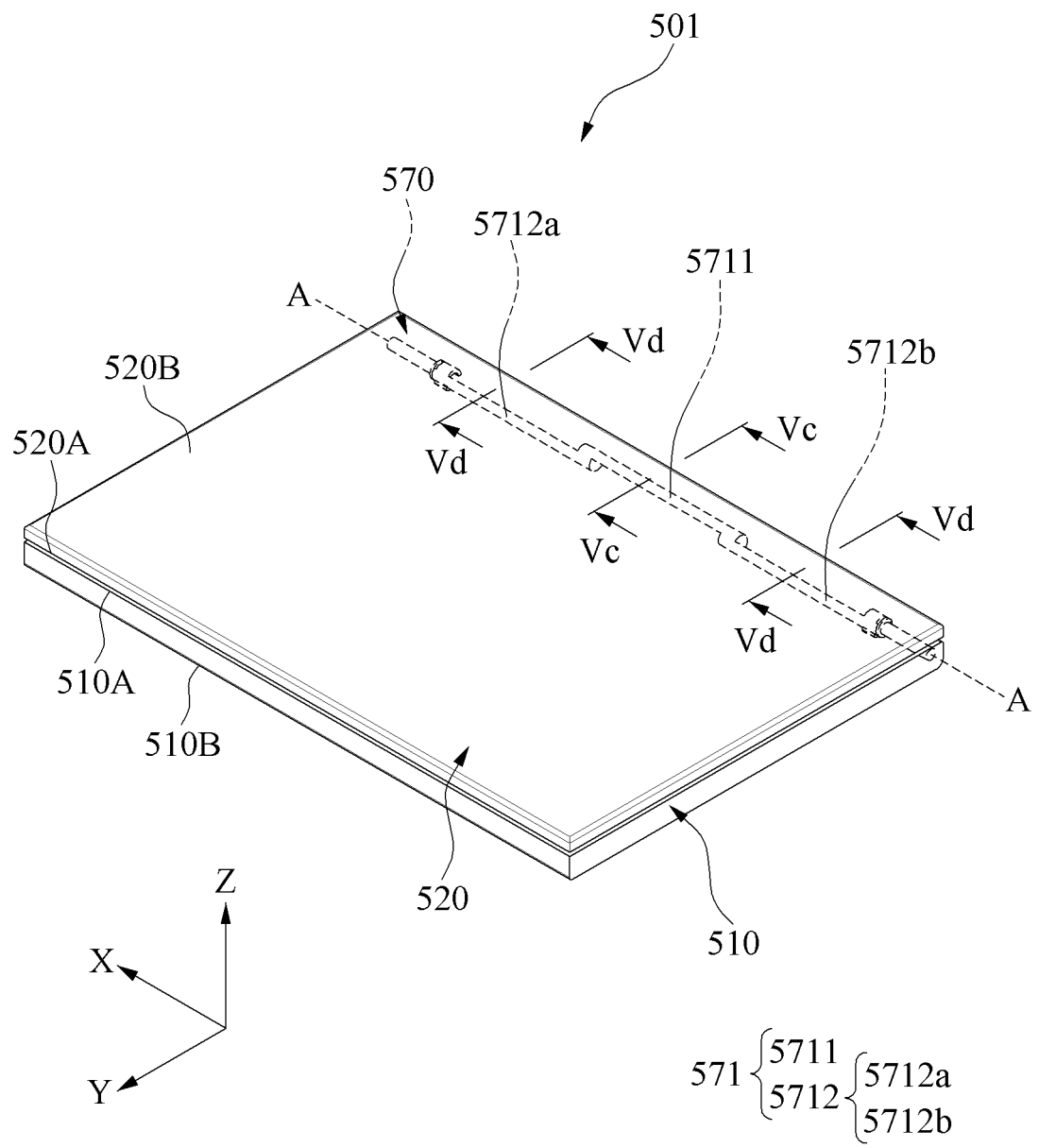
FIG. 5A is a perspective view illustrating a first state of an electronic device according to one embodiment.
Figure 5B:
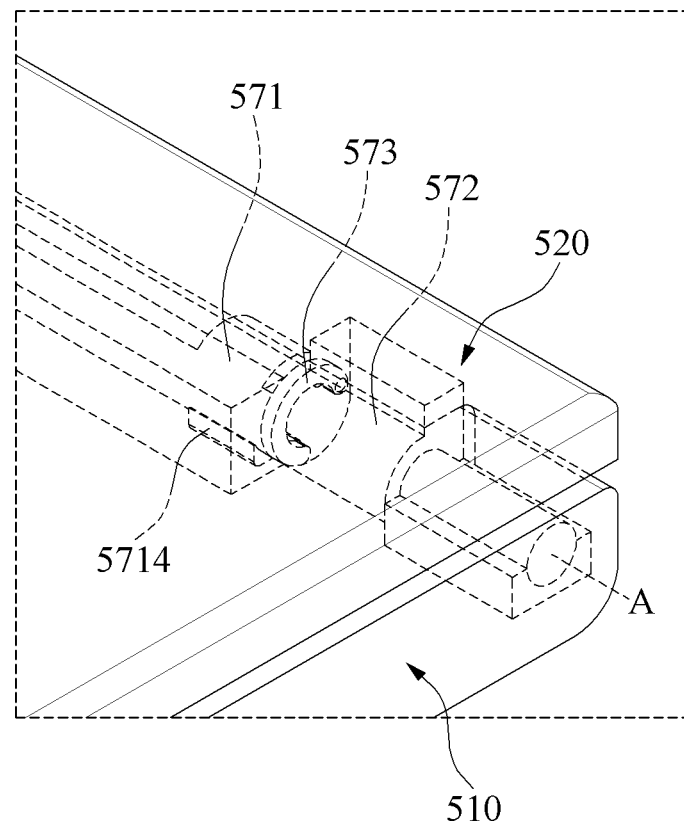
FIG. 5B is an enlarged perspective view illustrating a hinge structure in a first state of an electronic device.
Figure 5C:
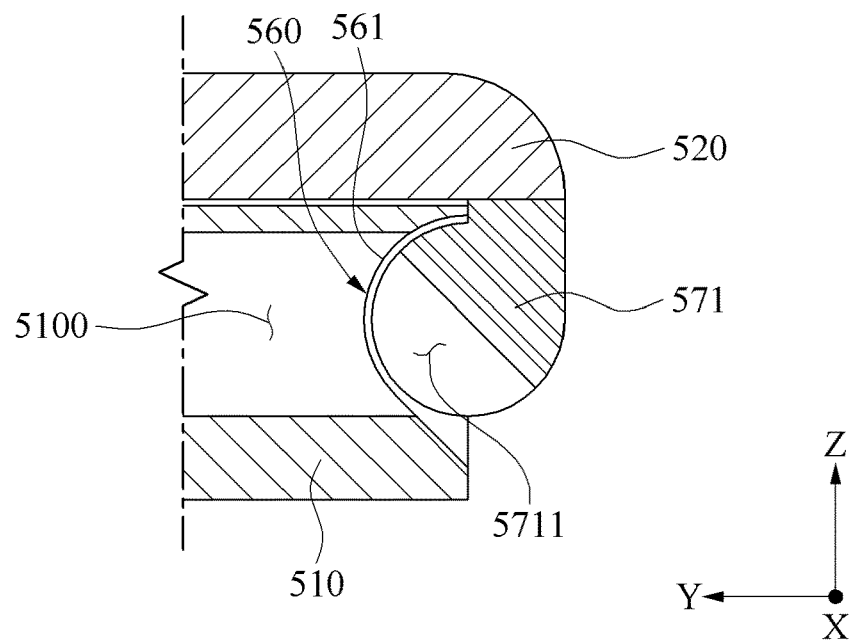
FIG. 5C is an enlarged cross-sectional view of the electronic device taken along a Vc-Vc line of FIG. 5A.
Figure 5D:
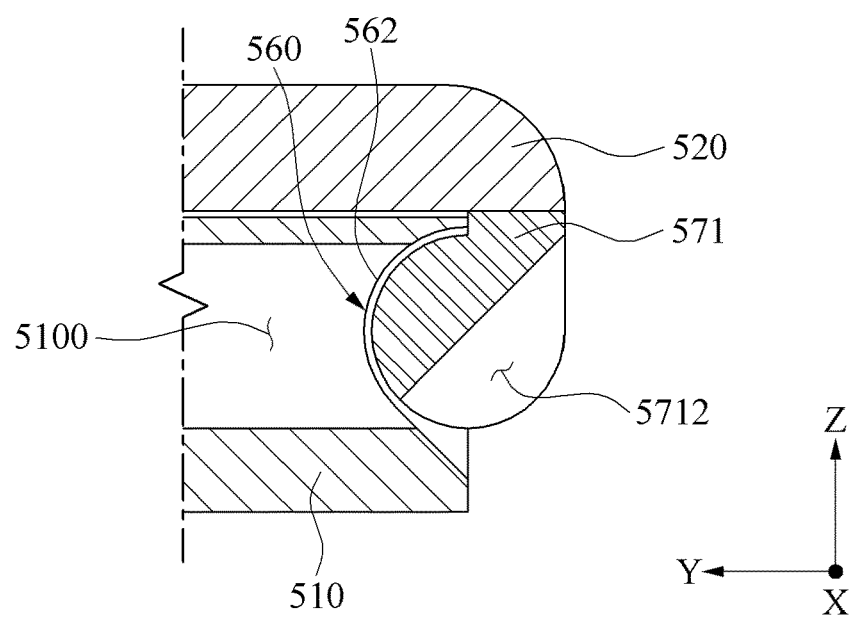
FIG. 5D is an enlarged cross-sectional view of the electronic device taken along a Vd-Vd line of FIG. 5A.

FIGS. 5A to 5D illustrate a first state of an electronic device 501. FIG. 5A is a perspective view illustrating a first state of the electronic device 501 according to one embodiment, FIG. 5B is an enlarged perspective view illustrating a hinge structure 570 in a first state of the electronic device 501, FIG. 5C is an enlarged cross-sectional view of the electronic device 501 taken along a Vc-Vc line of FIG. 5A, and FIG. 5D is an enlarged cross-sectional view of the electronic device 501 taken along a Vd-Vd line of FIG. 5A.

Referring to FIGS. 5A to 5D, in the first state of the electronic device 501 (e.g., the electronic device 101 of FIG. 1 and the electronic device 201 of FIG. 2A) according to one embodiment, a first surface 510A of the first housing 510 and a third surface 520A of the second housing 520 may substantially face each other. In this case, the first surface 510A and the third surface 520A may form a first angle (e.g., about 0 degrees to 5 degrees).

In one embodiment, the hinge structure 570 may be disposed along a rotation axis A and may rotatably connect the first housing 510 and the second housing 520. In one embodiment, a vent member 571 may be disposed to face an opening 560 of the first housing 510. A first vent portion 5711 of the vent member 571 may be disposed to correspond to an intake portion 561, and a second vent portion 5712 may be disposed to correspond to an exhaust portion 562. In one embodiment, a pair of second vent portions 5712a and 5712b may be formed on opposite sides of the first vent portion 5711. In one embodiment, based on the first state, the vent member 571 may close the intake portion 561 via the first vent portion 5711 as shown in FIG. 5C, and close the exhaust portion 562 via the second vent portion 5712 as shown in FIG. 5D, to minimize exposure of the opening 560 to the outside. Accordingly, in the first state of the electronic device 501, for example, in a closed state in which the electronic device 501 is not used, foreign material such as dust may be prevented from entering a first space 5100 inside the first housing 510 through the opening 560.

In one embodiment, in a first state as shown in FIG. 5B, a first fastening portion (e.g., the first fastening portion 4731 of FIG. 4H) of a connecting member 573 may be fastened to a second fastening portion (e.g., the second fastening portion 4720 of FIG. 4H) of a rotating member 572. In this case, when the second housing 520 rotates relative to the first housing 510, for example, when the electronic device 501 operates in a third state as shown in FIG. 6A, the connecting member 573 may transmit a rotational force of the rotating member 572 to the vent member 571 by rotating according to the rotation of the rotating member 572.

Figure 6B:
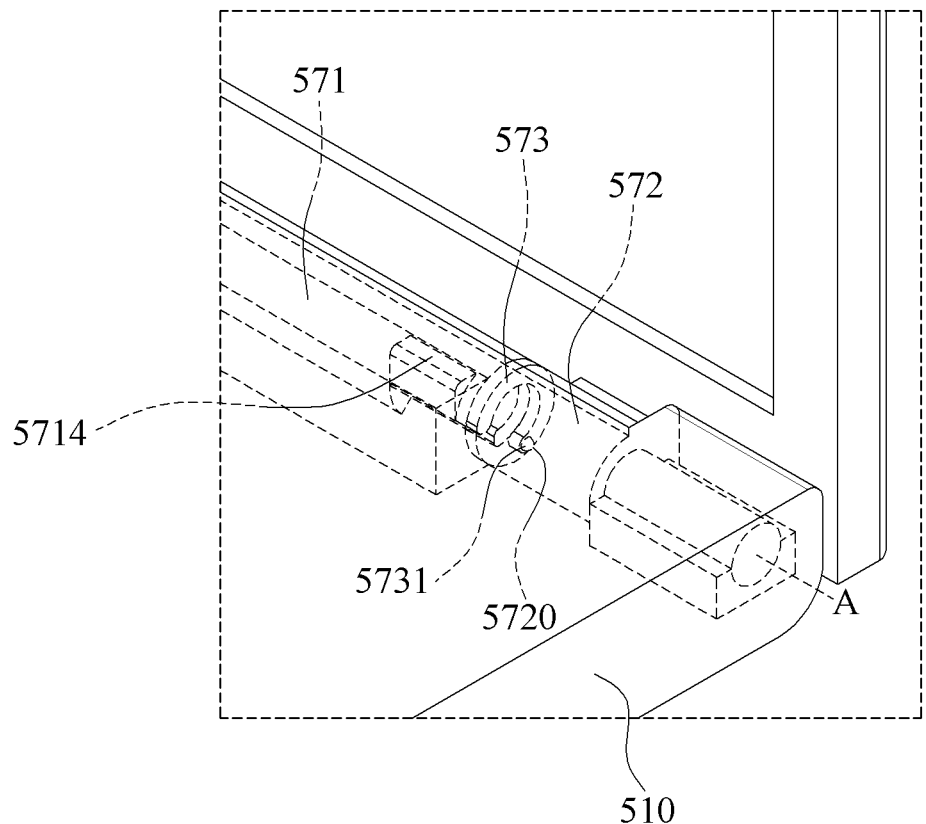
FIG. 6B is an enlarged perspective view illustrating a hinge structure in an open electronic device.
Figure 6C:
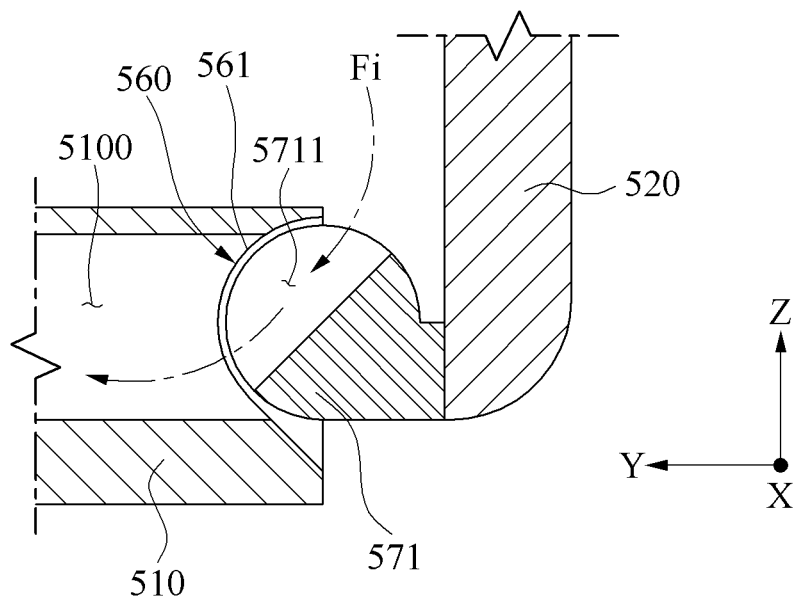
FIG. 6C is a cross-sectional view of the electronic device taken along line VIc-VIc of FIG. 6A.
Figure 6D:
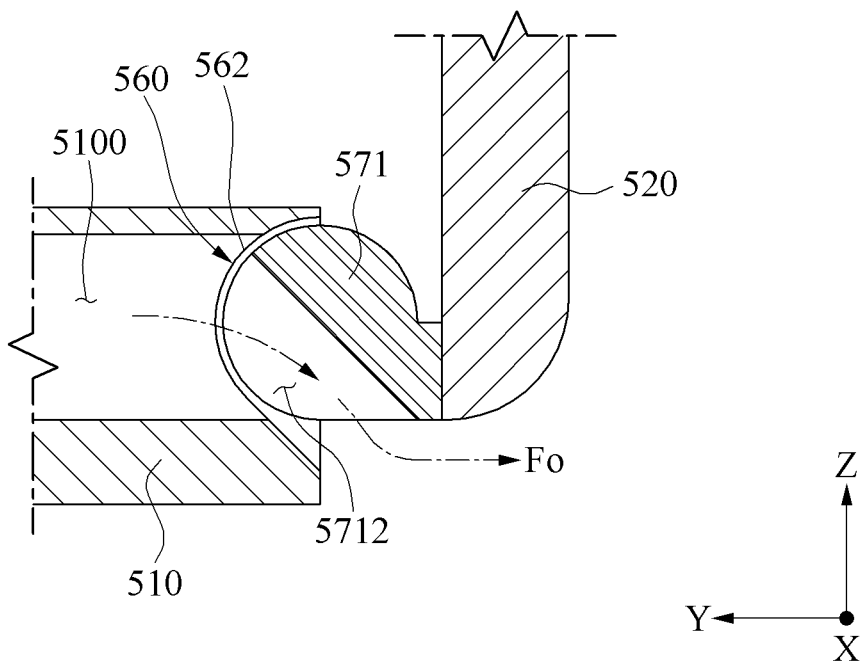
FIG. 6D is a cross-sectional view of the electronic device taken along line VId-VId of FIG. 6A.

FIGS. 6A to 6D illustrate a third state of the electronic device 501. FIG. 6A is a perspective view illustrating the electronic device 501 according to an embodiment, FIG. 6B is a diagram illustrating the hinge structure 570 in a third state of the electronic device 501, FIG. 6C is a cross-sectional view of the electronic device 501 taken along line VIc-VIc of FIG. 6A, and FIG. 6D is a cross-sectional view of the electronic device 501 taken along line VId-VId of FIG. 6A.

Referring to FIGS. 6A to 6D, in the third state of the electronic device 501 according to one embodiment, the first surface 510A of the first housing 510 and the third surface 520A of the second housing 520 may form a set third angle α3 (e.g., an angle set in a range of about 90 degrees to 120 degrees). In one embodiment, a display 530 may be disposed on the third surface 520A.

In one embodiment, when the electronic device 501 operates from the first state of FIG. 5A to the third state of FIG. 6A, the vent member 571 may rotate according to the rotation of the rotating member 572. In one embodiment, when the electronic device 501 reaches the third state, rotation of the vent member 571 may be restricted by a stopper 5714. For example, when an angle of the third surface 520A relative to the first surface 510A reaches the set third angle α3, the stopper 5714 may be caught on an end of the second housing 520, and may stop rotation of the vent member 571 when the angle of the third surface 520A relative to the first surface 510A is wider than the third angle α3. In one embodiment, based on the third state, the vent member 571 may guide a flow of air Fi flowing into the intake portion 561 from the outside through the first vent portion 5711 as shown in FIG. 6C. In this case, the first vent portion 5711 may guide the air Fi to be introduced into the first space 5100 from between the first surface 510A and the third surface 520A. In one embodiment, based on the third state, the vent member 571 may guide a flow of air Fo exhausted from the exhaust portion 562 to the outside through the second vent portion 5712 as shown in FIG. 6D. In this case, the first vent portion 5711 may guide the flow of the air Fo so that air is exhausted from the first space 5100 to between a second surface 510B and a fourth surface 520B.

In one embodiment, in the third state, a first fastening portion 5731 of the connecting member 573 may remain fastened to a second fastening portion 5720 of the rotating member 572 as shown in FIG. 6B. In this case, when the second housing 520 rotates to have a narrow angle relative to the first housing 510, for example, when the electronic device 501 operates to be in the first state as shown in FIG. 5A, the connecting member 573 may transmit a rotational force of the rotating member 572 to the vent member 571 by rotating according to the rotation of the rotating member 572.

Figure 7A:
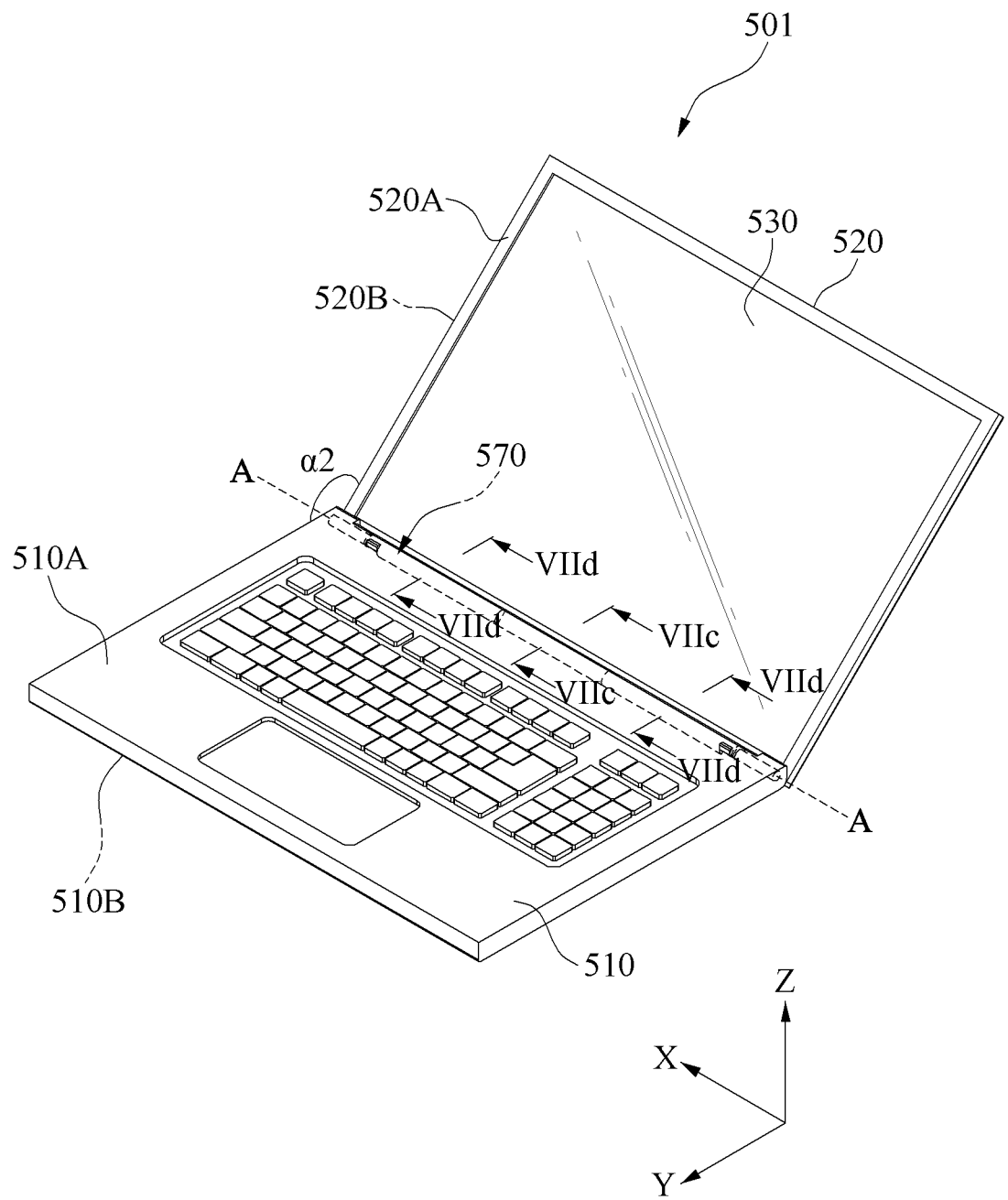
FIG. 7A is a diagram illustrating an electronic device which is open according to one embodiment.
Figure 7B:
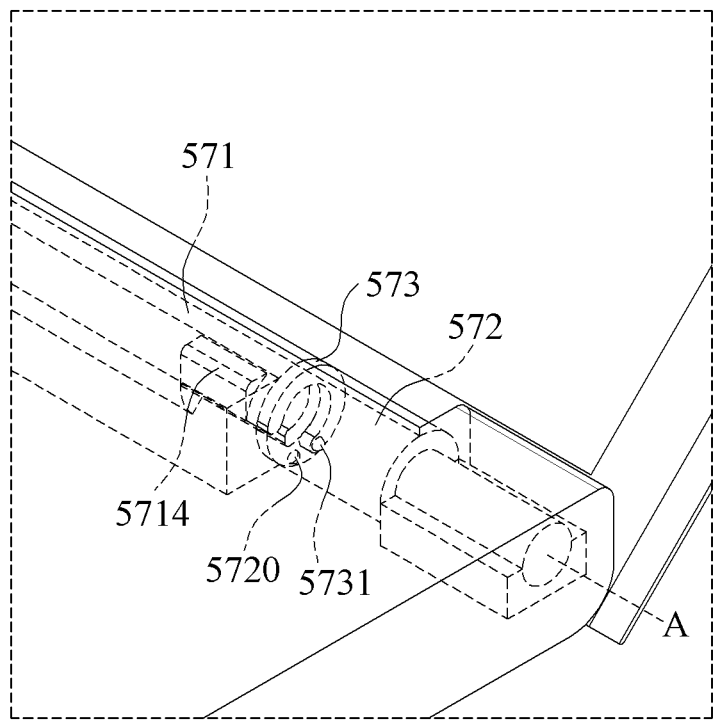
FIG. 7B is an enlarged perspective view illustrating a hinge structure in an open electronic device.
Figure 7C:
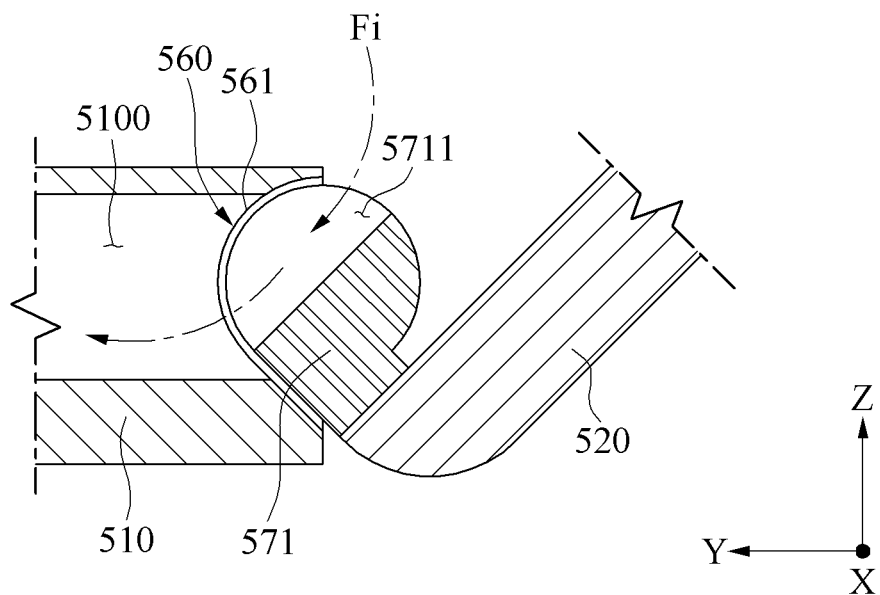
FIG. 7C is an enlarged cross-sectional view of the electronic device taken along line VIIc-VIIc line of FIG. 7A.
Figure 7D:
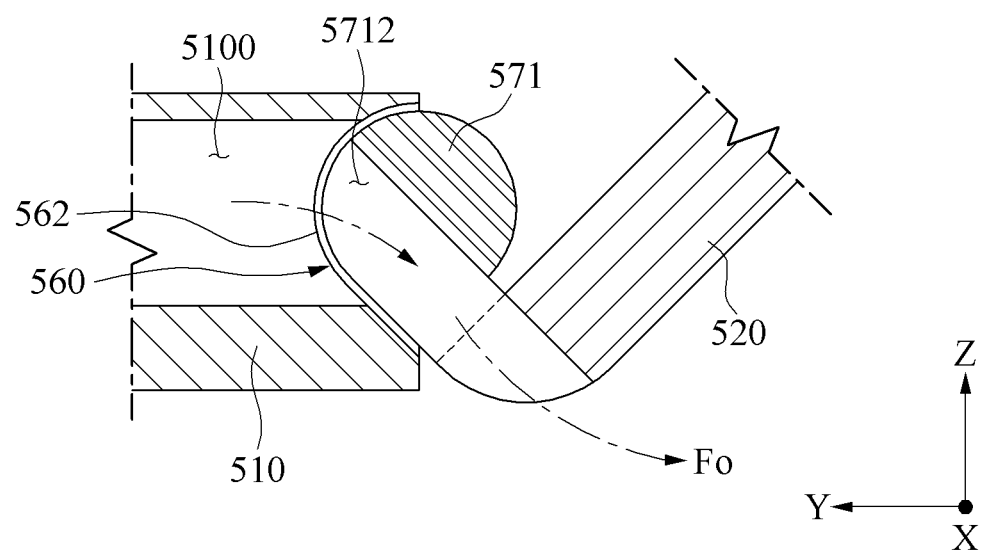
FIG. 7D is an enlarged cross-sectional view of the electronic device taken along line VIId-VIId of FIG. 7A.

FIGS. 7A to 7D illustrate a second state of the electronic device 501. FIG. 7A is a perspective view illustrating the electronic device 501 which is open according to an embodiment, FIG. 7B is an enlarged perspective view illustrating the hinge structure 570 in an second state of the electronic device 501, FIG. 7C is an enlarged cross-sectional view of the electronic device 501 taken along a line VIIc-VIIc of FIG. 7A, and FIG. 7D is an enlarged cross-sectional view of the electronic device 501 taken along a line VIId-VIId of FIG. 7A.

Referring to FIGS. 7A to 7D, in the second state of the electronic device 501 according to one embodiment, the first surface 510A of the first housing 510 and the third surface 520A of the second housing 520 may form a second angle α2 (e.g., a maximum angle set in a range of about 120 degrees to 180 degrees) that is a maximum angle.

In one embodiment, when the state of the electronic device 501 changes from the third state of FIG. 6A to the second state of FIG. 7A, the vent member 571 may maintain a stopped state regardless of the operation of the electronic device 501 since rotation of the vent member 571 is restricted by the stopper 5714. Based on an angle of rotation about the rotation axis A, a rotation angle of the vent member 571 may be kept constant between the third state of FIG. 6A and the second state of FIG. 7A. In this case, the first vent portion 5711 may guide the air Fi introduced into the first space 5100 from between the first surface 510A and the third surface 520A as shown in FIG. 7C, and the second vent portion 5712 may guide the air Fo exhausted from the first space 5100 to the second surface 510B and the fourth surface 520B as shown in FIG. 7D.

In one embodiment, in the second state, the first fastening portion 5731 of the connecting member 573 may be separated from the second fastening portion 5720 of the rotating member 572 as shown in FIG. 7B. In one embodiment, when the state of the electronic device 501 changes from the third state of FIG. 6B to the second state of FIG. 7B, the rotating member 572 may rotate about the rotation axis A according to the operation of the electronic device 501, and rotation of the connecting member 573 may be restricted by the vent member 571 such that the first fastening portion 5731 is separated from the second fastening portion 5720. For example, a shape of the connecting member 573 may be deformed so that the first fastening portion 5731 is separated from the second fastening portion 5720 by a rotational force of the rotating member 572. In this case, since the connecting member 573 does not interfere with the rotation of the rotating member 572 between the third state and the second state of the electronic device 501, the rotating member 572 may rotate according to the operation of the electronic device 501 regardless of rotation being restricted by the vent member 571. On the other hand, when a state of the electronic device 501 is changed from the second state of FIG. 7B to the third state of FIG. 6B, for example, when angles of the first housing 510 and the second housing 520 are decreased to become the set third angle α3, the first fastening portion 5731 of the connecting member 573 may be fastened to the second fastening portion 5720 of the rotating member 572 as shown in FIG. 6B.

Figure 8B:
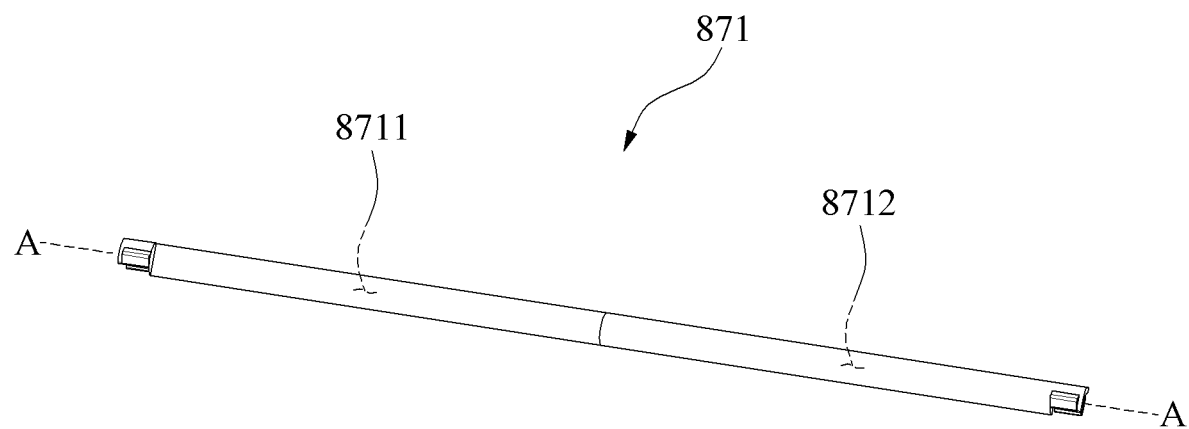
FIG. 8B is a perspective view of a vent member according to an embodiment.
Figure 8C:
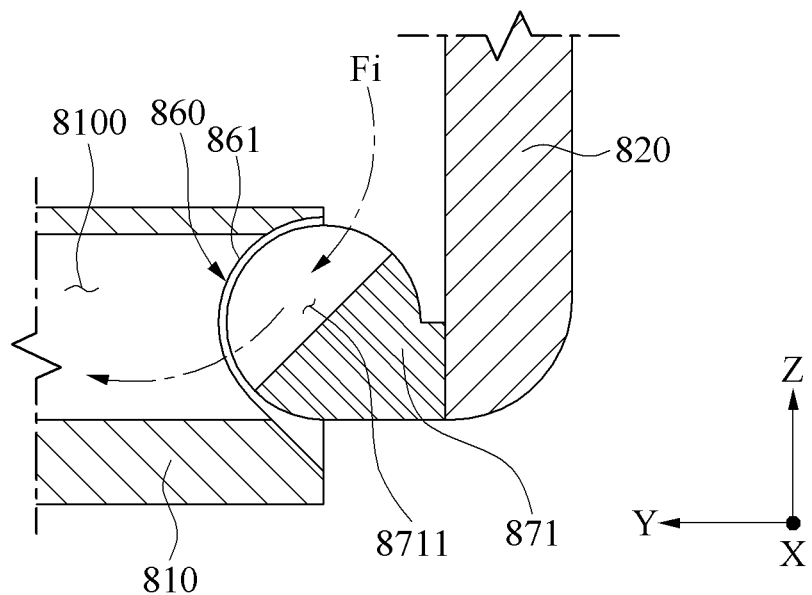
FIG. 8C is a cross-sectional view of the electronic device taken along line VIIIc-VIIIc of FIG. 8A.
Figure 8D:
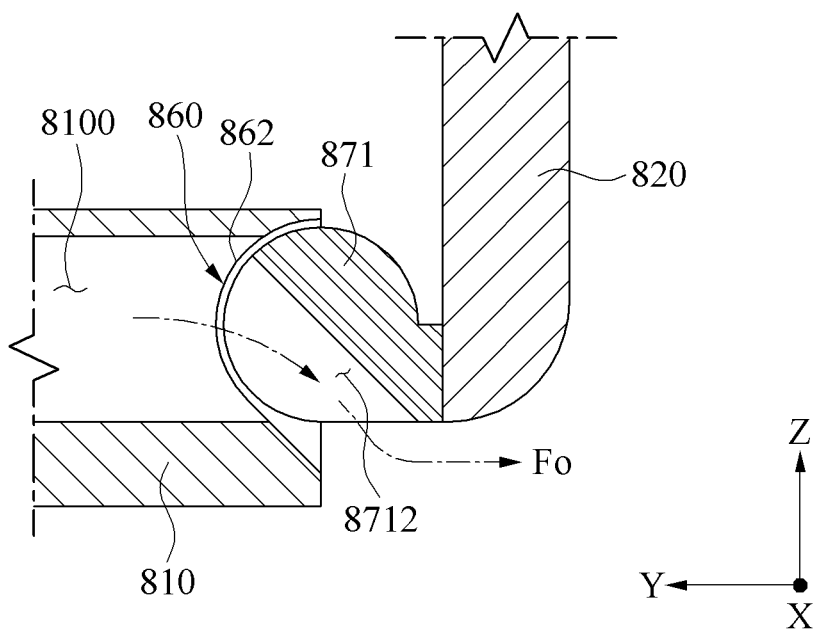
FIG. 8D is a cross-sectional view of the electronic device taken along line VIIId-VIIId of FIG. 8A.

FIG. 8A is a perspective view illustrating an air flow according to an operation of a fan component in a third state of an electronic device according to an embodiment, FIG. 8B is a perspective view of a vent member according to an embodiment, FIG. 8C is a cross-sectional view of the electronic device taken along a line VIIIc-VIIIc of FIG. 8A, and FIG. 8D is a cross-sectional view of the electronic device taken along a line VIIId-VIIId of FIG. 8A.

Referring to FIGS. 8A to 8D, an electronic device 801 according to one embodiment may include a first housing 810, a second housing 820, a display 830, a fan component 850, and a hinge structure 870.

In one embodiment, the first housing 810 and the second housing 820 may form an exterior of the electronic device 801. The first housing 810 may include a first surface 810A and a second surface 810B opposite to the first surface 810A, and the second housing 820 may include a third surface 820A facing the first surface 810A and a fourth surface 820B opposite to the third surface 820A. In one embodiment, the second surface 810B of the first housing 810 may be supported on a support surface (e.g., a floor surface or a support surface of a structure such as a desk). In one embodiment, a first space 8100 in which components for performing a function of the electronic device 801 are disposed may be formed in the first housing 810. In one embodiment, the first housing 810 may include an opening (e.g., the opening 360 of FIG. 3C) that is formed to face the hinge structure 870, and through which the first space 8100 communicates with the outside. In one embodiment, the display 830 may be disposed to be visually exposed to the outside through the third surface 820A.

In one embodiment, the fan component 850 may be disposed in the first space 8100, and may adjust a temperature inside the first space 8100 by circulating air between the first space 8100 and the outside. In one embodiment, one fan component 850 may be disposed in the first space 8100. For example, the fan component 850 may be disposed in a central portion of the first space 8100 relative to a direction of a rotation axis A. In this case, the fan component 850 may suck and circulate air from the outside through a left portion (e.g., a +X-axial direction) of the first housing 810 in the direction of the rotation axis A, and discharge the air to a right side (e.g., a −X-axial direction) of the first housing 810.

In one embodiment, the hinge structure 870 may rotatably connect the first housing 810 and the second housing 820. In one embodiment, the hinge structure 870 may include a vent member 871, a rotating member 872, and a connecting member 873.

In one embodiment, the hinge structure 870 may include the vent member 871 for guiding a flow of air between the first space 8100 and the outside. In one embodiment, the vent member 871 may include a first vent portion 8711 for guiding a flow of air introduced into the first space 8100 from the outside, and a second vent portion 8712 for guiding a flow of air discharged from the first space 8100 to the outside. In one embodiment, based on the direction of the rotation axis A, the first vent portion 8711 may be formed on a left side (e.g., a +X-axial direction) of the vent member 871, and the second vent portion 8712 may be formed on a right side (e.g., a −X-axial direction) of the vent member 871. The first vent portion 8711 and the second vent portion 8712 may be formed in the vent member 871 to be separated from each other so that air passing through the first vent portion 8711 and the second vent portion are not mixed with each other. In one embodiment, the vent member 871 may be disposed to face an opening 860 formed in the first housing 810 allowing the first space 8100 to communicate with the outside. In this case, the first vent portion 8711 may be disposed to face an intake portion 861 of the opening 860, and the second vent portion 8712 may be disposed to face an exhaust portion 862 of the opening 860.

In one embodiment, the vent member 871 may rotate about the rotation axis A according to a rotation of the second housing 820 relative to the first housing 810 between a first state (e.g., the first state of FIG. 2A) and a third state of the electronic device 801, and rotation about the rotation axis A may be stopped between the third state and a second state (e.g., the second state of FIG. 2B). In one embodiment, in a state in which the third surface 820A of the second housing 820 has a third angle α3 set relative to the first surface 810A as shown in FIG. 8A, the vent member 871 may guide air Fi introduced into the first space 8100 through the intake portion 861 of the opening 860 from a space between the first surface 810A and the third surface 820A through the first vent portion 8711 as shown in FIG. 8C, and guide air Fo exhausted from the first space 8100 through the second vent portion 8712 to between the second surface 810B and the fourth surface 820B through the exhaust portion 862 of the opening 860 as shown in FIG. 8D.

Figure 9B:
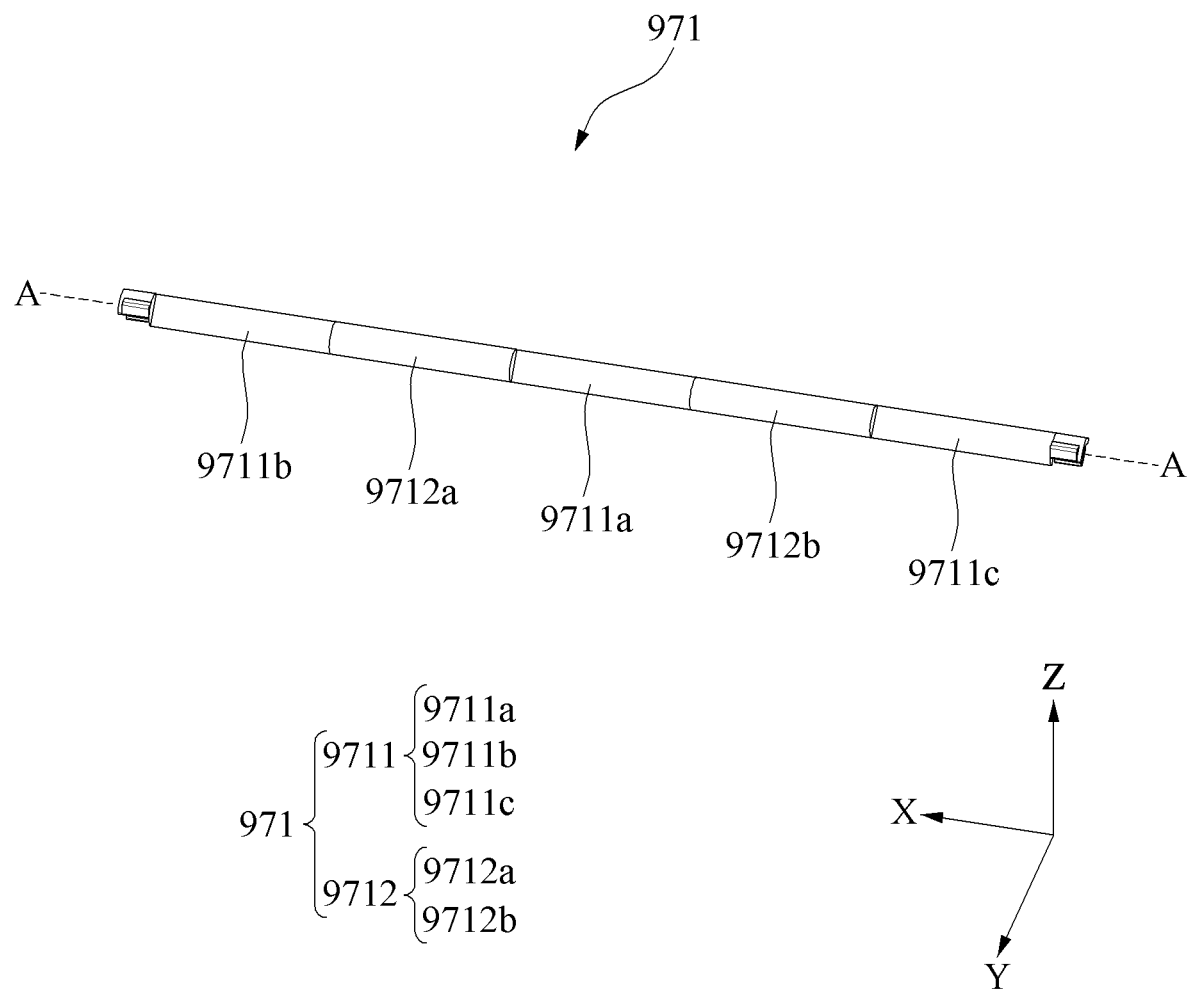
FIG. 9B is a perspective view of a vent member according to an embodiment.
Figure 9C:
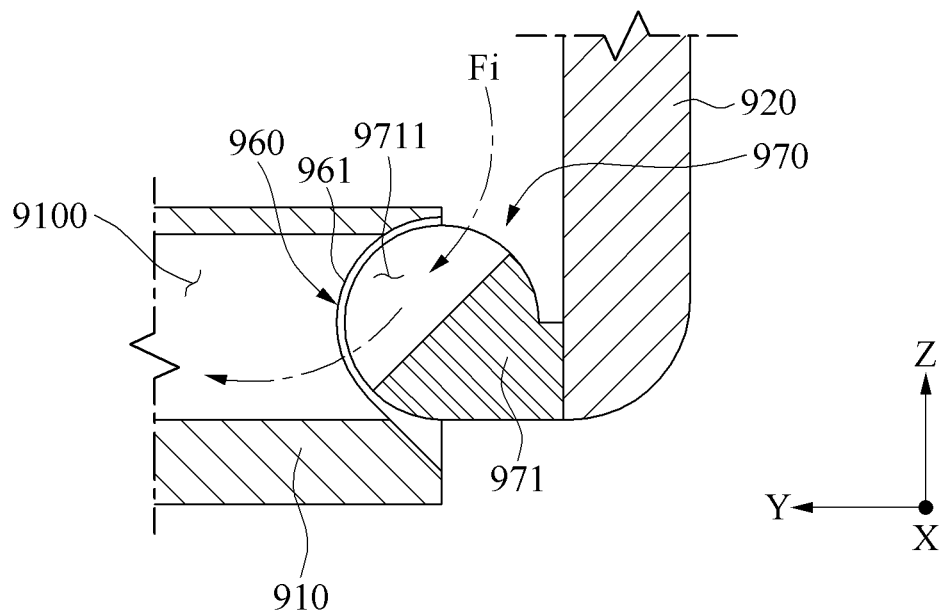
FIG. 9C is an enlarged cross-sectional view of the electronic device taken along line IXc-IXc of FIG. 9A.
Figure 9D:
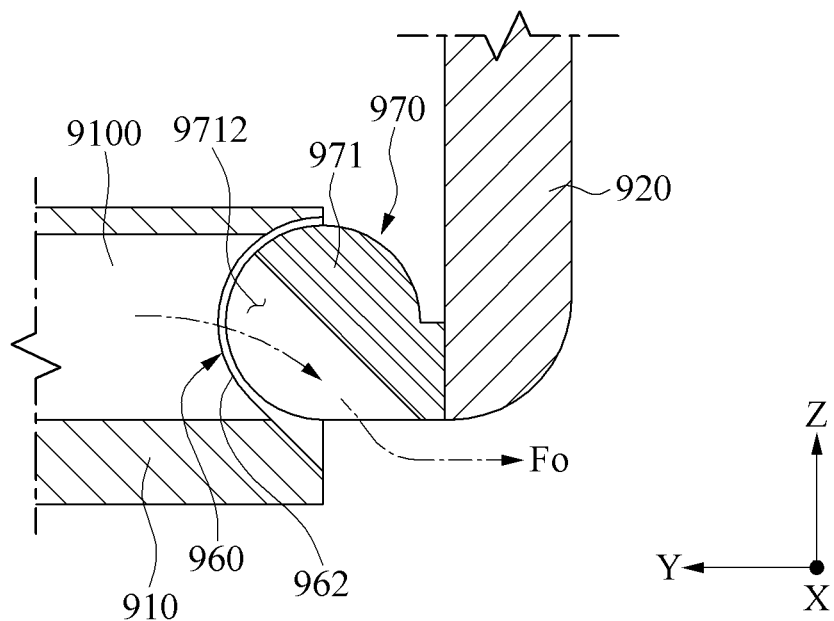
FIG. 9D is an enlarged cross-sectional view of the electronic device taken along line IXd-IXd of FIG. 9A.

FIG. 9A is a perspective view illustrating an air flow according to an operation of a fan component in a third state of an electronic device according to an embodiment, FIG. 9B is a perspective view of a vent member according to an embodiment, FIG. 9C is an enlarged cross-sectional view of the electronic device taken along a line IXc-IXc of FIG. 9A, and FIG. 9D is an enlarged cross-sectional view of the electronic device taken along a line IXd-IXd of FIG. 9A.

Referring to FIGS. 9A to 9D, an electronic device according to one embodiment may include a first housing 910, a second housing 920, a display 930, a fan component 950, and a hinge structure 970.

In one embodiment, the first housing 910 and the second housing 920 may form an exterior of the electronic device. The first housing 910 may include a first surface 910A and a second surface 910B opposite to the first surface 910A. The second surface 910B of the first housing 910 may be supported on a support surface (e.g., a floor surface or a support surface of a structure such as a desk) via the second surface 910B. The second housing 920 may include a third surface 920A facing the first surface 910A and a fourth surface 920B opposite to the third surface 920A. In one embodiment, the display 930 may be visually exposed on the third surface 920A. In one embodiment, a first space 9100 in which a component (e.g., a battery, a PCB, and the like) for performing a function of an electronic device is disposed may be formed in the first housing 910. In one embodiment, the first housing 910 may include an opening 960 (e.g., the opening 360 of FIG. 3C) that is formed to face the hinge structure 970, and through which air passes between the first space 9100 and the outside.

In one embodiment, a plurality of fan components 950 may be disposed in the first space 9100. The plurality of fan components 950 may be disposed spaced apart from each other in the first space 9100 and may generate an air flow in the first space 9100 according to each operation. For example, as shown in FIG. 9A, the plurality of fan components 950 may be disposed in the first space 9100 in a direction parallel to a rotation axis A, and may introduce air Fi from the outside to the first space 9100 and exhaust air Fo from the first space 9100 to the outside through the opening 960 according to each operation.

In one embodiment, the hinge structure 970 may rotatably connect the first housing 910 and the second housing 920. The hinge structure 970 may include a vent member 971 for guiding a flow of air passing between the first space 9100 and the outside. In one embodiment, the vent member 971 may include a first vent portion 9711 for guiding a flow of intake air Fi introduced into the first space 9100 from the outside, and a second vent portion 9712 for guiding a flow of exhaust air Fo discharged from the first space 9100 to the outside. In one embodiment, a plurality of first vent portions 9711a, 9711b, and 9711c and second vent portions 9712a and 9712b may be formed in the vent member 971 to correspond to an arrangement of a plurality of fan components 950 disposed in the first space 9100. For example, as shown in FIG. 9A, when a plurality of fan components 950 are disposed inside the first space 9100 to suck and exhaust air according to each operation, the vent member 971 may include a plurality of first vent portions 9711a, 9711b, and 9711c and a plurality of second vent portions 9712a and 9712b formed in positions corresponding to a plurality of air intake portions 961 and exhaust portions 962. In one embodiment, based on a direction parallel to the rotation axis A, the plurality of first vent portions 9711a, 9711b, and 9711c and the plurality of second vent portions 9712a and 9712b may be formed alternately in the vent member 971. In this case, the first vent portions 9711a, 9711b, and 9711c and the second vent portions 9712a and 9712b formed in the vent member 971 may be formed separately so that air passing through each other are not mixed with each other.

In one embodiment, the vent member 971 may rotate about the rotation axis A according to a rotation of the second housing 920 relative to the first housing 910 between a first state (e.g., the first state of FIG. 2A) and a third state of the electronic device, and rotation about the rotation axis A may be stopped between the third state and a second state (e.g., the second state of FIG. 2B). In one embodiment, in a state in which the third surface 920A of the second housing 920 has a third angle α3 set relative to the first surface 910A as shown in FIG. 9A, the vent member 971 may guide air Fi introduced into the first space 9100 through the first vent portions 9711a, 9711b, and 9711c from a space between the first surface 910A and the third surface 920A as shown in FIG. 9C, and guide air Fo exhausted from the first space 9100 through the second vent portions 9712a and 9712b to between the second surface 910B and the fourth surface 920B as shown in FIG. 9D.

According to embodiments, an electronic device 201 may include a first housing 210 including a first surface 210A (e.g., a front surface) and a second surface 210B (e.g., a rear surface) which is opposite to the first surface 210A, a second housing 220 including a third surface 220A (e.g., a front surface) and a fourth surface 220B (e.g., a rear surface) opposite to the third surface 220A, a display 230 which displays an image and visually exposed through the third surface 220A, one or more fan component 350 disposed in a first space 2100 inside the first housing 210, and a hinge structure 370 rotatably connecting the first housing 210 and the second housing 220 about a rotation axis A such that an angle between the first surface 210A and the third surface 220A changes between a first angle in a first state in which the first surface 210A and the third surface 220A face each other and a second angle in a second state in which the first surface 210A and the third surface 220A are maximally widened, where the first housing 210 may include an opening 360 formed at a position facing the hinge structure 370, and including an intake portion 361 configured to suck air into the first space 2100 from the outside according to an operation of the fan component 350 and exhaust portions 362a and 362b configured to discharge air from the first space 2100 to the outside, and the hinge structure 370 may be configured to rotate about the rotation axis A, and may include a vent member 471 in which a first vent portion 4711 for guiding a flow of air between the intake portion 361 and the outside, and a second vent portion 4712 for guiding a flow of air between the exhaust portions 362a and 362b and the outside are formed, and where in a third state in which the angle between the first surface 210A and the third surface 220A forms a third angle between the first angle and the second angle, the first vent portion 4711 and the second vent portion 4712 may guide the flow of air in different directions from each other.

The first surface 210A and the third surface 220A may together form a plurality of front surfaces and the second surface 210B and the fourth surface 220B may together form a plurality of rear surface.

In an embodiment, an electronic device includes a first housing including a first surface at a front side of the electronic device, a second surface which is opposite to the first surface and at a rear side of the electronic device, an inner space in communication with an outside of the first housing, an intake opening connected to the inner space and through which air flows to the inner space from the outside of the first housing, and an exhaust opening connected to the inner space and through which air flows from the inner space to the outside of the first housing, a second housing including a third surface at the front side of the electronic device, and a fourth surface which is opposite to the third surface and at the rear side of the electronic device, a display visually exposed at the third surface, a fan which is in the inner space of the first housing, and a hinge structure rotatably connecting the first housing and the second housing to each other, about a rotation axis. The hinge structure including a vent member which rotates about the rotation axis, together with rotation of the first housing relative to the second housing. The vent member including a first vent portion which guides first air flow between the intake opening and an outside of the electronic device, together with operation of the fan, and a second vent portion which guides second air flow between the exhaust opening and the outside of the electronic device, together with the operation of the fan, where the first surface and the third surface which face each other define a first angle between the first housing and the second housing, the first surface and the third surface which are disposed at a maximum rotational distance from each other define a second angle between the first housing and the second housing, and the first surface and the third surface which define a third angle between the first angle and the second angle, rotates the vent member to dispose the first vent portion guiding the first air flow in a direction relative to the front side of the electronic device, together with the second vent portion guiding the second air flow in a different direction from that of the first vent portion, relative to the front side of the electronic device.

According to embodiments, the vent member 471 may rotate between the first state and the third state and stop between the third state and the second state. That is, the rotation of the first housing relative to the second housing, between the first angle and the third angle, rotates the vent member, and the rotation of the first housing relative to the second housing, between the third angle and the second angle, stops rotation of the vent member.

According to embodiments, the vent member 471 may include a stopper 4714 formed on an outer surface, and the stopper 4714 may limit rotation of the vent member 471 during a change between the third state and the second state by being in contact with an end of the first housing 210 in the third state. That is, the hinge structure further includes a stopper connected to the vent member, the first surface and the third surface which define the third angle therebetween, dispose the stopper in contact with an end of the first housing, and the stopper in contact with the end of the first housing, limits rotation of the vent member during the rotation of the first housing relative to the second housing, between the third angle and the second angle.

According to embodiments, the hinge structure 370 may further include a rotating member 472 at least partially fixed to the second housing 220 and rotatably connected to the first housing 210, and a connecting member 473 connecting the rotating member 472 and the vent member 471, and configured to transmit a rotational force according to a rotation of the rotating member 472 to the vent member 471. In an embodiment, for example, the electronic device may include a rotational connecting member (e.g., connecting member 473 with rotating member 472) which is fixed to and rotatable together with the second housing, connects the second housing to the hinge structure, at the vent member, and transmits a rotational force from the rotation of the first housing relative to the second housing, to the vent member.

According to embodiments, the connecting member 473 may transmit the rotational force of the rotating member 472 to the vent member 471 such that the rotating member 472 and the vent member 471 rotate together during a change between the first state and the third state, and may prevent transmission of the rotational force of the rotating member 472 to the vent member 471 such that the rotating member 472 rotates independently relative to the vent member 471 during a change between the third state and the second state. That is, the rotation of the first housing relative to the second housing, between the first angle and the third angle, rotates the rotational connecting member together with the vent member, and the rotation of the first housing relative to the second housing, between the third angle and the second angle, prevents transmission of the rotational force to the vent member and rotates the rotational connecting member independently from the vent member.

According to embodiments, in the connecting member 473, a first connecting surface 4730a may be attached to an end of the vent member 471 facing the rotating member 472 along a direction of the rotation axis A, and the connecting member 473 may include a first fastening portion 4731 formed on a second connecting surface 4730b opposite to the first connecting surface 4730a, and the rotating member 472 may include a second fastening portion 4720 formed at an end of the rotating member 472 facing the vent member 471 along the direction of the rotation axis A, where the first fastening portion 4731 and the second fastening portion 4720 may be engaged and fastened during a change between the first state and the third state, and separated during a change between the third state and the second state. That is, the rotational connecting member further includes a rotating member at which the rotational connecting member is fixed to the second housing, and a connecting member connecting the rotating member and the vent member to each other, the connecting member transmitting the rotational force to the vent member. The connecting member includes a first fastening portion engageable with the rotating member, the rotating member includes a second fastening portion at which the first fastening portion of the connecting member is engaged, the rotation of the first housing relative to the second housing, between the first angle and the third angle, engages the first and second fastening portions, and the rotation of the first housing relative to the second housing, between the third angle and the second angle, disposes the first and second fastening portions disengaged with each other.

According to embodiments, a concave portion 4710 that is concave in the direction of the rotation axis A and overlaps with the first fastening portion may be formed at the end of the vent member 471, and while the first state is changing to the second state through operation, the first fastening portion 4731 may be pressed in a direction of the concave portion 4710 to be separated from the second fastening portion 4720. That is, the vent member further includes a concave portion defined at an end of the vent member, the first fastening portion overlaps the concave portion of the vent member, and the rotation of the first housing relative to the second housing, between the first angle and the second angle, presses the first fastening portion toward the concave portion to separate the first fastening portion from the second fastening portion.

According to embodiments, the connecting member 473 may be formed of an elastic material, and while the third state is changing to the second state through operation, the first fastening portion 4731 may be separated from the second fastening portion 4720 while being deformed in the direction of the rotation axis A. That is, the rotation of the first housing relative to the second housing, between the third angle and the second angle, deforms the first fastening portion in the direction of the rotation axis, to separate the first fastening portion from the second fastening portion.

According to embodiments, in the third state, the first vent portion 4711 may guide the air sucked into the intake portion 361 from between the first surface 210A and the third surface 220A, and the second vent portion 4712 may guide the air discharged from the exhaust portions 362a and 362b from between the second surface 210B and the fourth surface 220B. That is, the first surface and the third surface which define the third angle therebetween, define the first air flow guided by the first vent portion, from the first surface and the third surface each at the front side of the electronic device, and toward the intake opening of the first housing, together with defining the second air flow guided by the second vent portion, from the exhaust opening of the first housing, toward the second surface and the fourth surface each at the rear side of the electronic device.

According to embodiments, in a state in which an angle between the first surface 210A and the third surface 220A is greater than or equal to the third angle, a direction in which the air of the first vent portion 4711 and the second vent portion 4712 is guided relative to the first surface 210A may be constant. That is, the vent member defines an air flow direction along the vent member, relative to the front side of the electronic device, and the first surface and the third surface which define the third angle therebetween, and the first surface and the third surface which define the second angle therebetween, rotate the vent member to define a same air flow direction along the vent member.

According to embodiments, in the first state, the first vent portion 4711 may close the intake portion 361, and the second vent portion 4712 may close the exhaust portions 362a and 362b. That is, the first surface and the third surface which define the first angle therebetween, dispose the first vent portion of the hinge structure rotated to close the intake opening of the first housing, together with disposing the second vent portion of the hinge structure rotated to close the exhaust opening of the first housing.

According to embodiments, based on a cross-section perpendicular to the rotation axis A, the first vent portion 4711 may include an inwardly concave shape, and the second vent portion 4712 may include an inwardly concave shape in a different direction from the first vent portion 4711. That is, within the hinge structure, the first vent portion includes an inwardly concave shape open in a direction, relative to the rotation axis, and the second vent portion includes an inwardly concave shape open in a different direction from the direction of the inwardly concave shape of the first vent portion, relative to the rotation axis.

According to embodiments, based on a direction parallel to the rotation axis A, the vent member 471 may be formed such that the second vent portions 4712a and 4712b are positioned on opposite sides of the first vent portion 4711, respectively. That is, within the vent member, the second vent portion is provided in plural to define second vent portions, and along the rotation axis, the second vent portions are on opposite sides of the first vent portion, respectively.

According to embodiments, a plurality of the first vent portions 9711 and a plurality of the second vent portions 9712 may be alternately formed in the vent member 971 along the direction parallel to the rotation axis A. That is, within the vent member, the first vent portion and the second vent portion are each provided in plural to respectively define a plurality of first vent portions and a plurality of second vent portions, and the plurality of first vent portions alternate with the plurality of second vent portions, along the rotation axis.

According to embodiments, the first vent portion 4711 and the second vent portion 4712 may be separately formed along a direction parallel to the rotation axis A so that the air guided through the first vent portion 4711 and the air guided through the second vent portion 4712 are not mixed with each other. That is, within the vent member, the first vent portion and the second vent portion are spaced apart from each other along the rotation axis.

According to embodiments, an electronic device 201 may include a first housing 210 including a first surface 210A and a second surface 210B opposite to the first surface 210A, a second housing 220 including a third surface 220A and a fourth surface 220B opposite to the third surface 220A, and may be configured to rotate about a rotation axis A relative to the first housing 210 allowing change between a first state in which the third surface 220A forms a first angle relative to the first surface 210A and a second state in which the third surface 220A forms a second angle relative to the first surface 210A, a display 230 disposed on the third surface 220A, one or more fan component 350 disposed in a first space 2100 inside the first housing 210, and a hinge structure 370 disposed along the rotation axis A and rotatably connecting the first housing 210 and the second housing 220, where the first housing 210 includes an opening 360 formed at an end of the first housing facing the hinge structure 370, the opening 360 being open in a direction parallel to the rotation axis A and including an intake portion 361 configured to suck external air into the first space 2100 and exhaust portions 362a and 362b configured to discharge air from the first space 2100 to the outside, according to an operation of the fan component 350, and the hinge structure 370 may include a vent member 471 in a longitudinal direction parallel to the rotation axis A and including a first vent portion 4711 formed in a portion overlapping the intake portion 361 and a second vent portion 4712 formed in a portion overlapping the exhaust portions 362a and 362b in a state in which the opening 360 is viewed, and in a state in which the third surface 220A has an angle greater than or equal to a third angle between the first angle and the second angle relative to the first surface 210A, the intake portion 361 may suck air from a space between the first surface 210A and the third surface 220A through the first vent portion 4711, and the exhaust portions 362a and 362b may exhaust air between the second surface 210B and the fourth surface 220B through the second vent portion 4712. In an embodiment, the first surface and the third surface which define a third angle between the first angle and the second angle, rotates the vent member to dispose the first vent portion guiding a first air flow from the first surface and the third surface each at the front side of the electronic device, toward the intake opening of the first housing, together with defining a second air flow guided by the second vent portion, from the exhaust opening of the first housing, toward the second surface and the fourth surface each at the rear side of the electronic device.

According to embodiments, the vent member 471 may rotate about a rotation axis A according to the rotation of the second housing 220 relative to the first housing 210, during a change between the first state and the third state, and stop rotating during a change between the third state and the second state. That is, the rotation of the first housing relative to the second housing, between the first angle and the third angle, rotates the vent member, and the rotation of the first housing relative to the second housing, between the third angle and the second angle, stops rotation of the vent member.

According to embodiments, the hinge structure 370 may further include a rotating member 472 connecting the first housing 210 and the second housing 220 and configured to rotate about the rotation axis A according to the rotation of the second housing 220 relative to the first housing 210, and a connecting member 473 connecting the rotating member 472 and the vent member 471 in a direction of the rotation axis A, and the connecting member may transmit a rotational force of the rotating member 472 to the vent member 471 during a change between the first state and the third state, and prevent transmission of the rotational force of the rotating member 472 to the vent member 471 during a change between the third state and the second state. That is, a rotational connecting member which is fixed to and rotatable together with the second housing, connects the second housing to the hinge structure, at the vent member, and transmits a rotational force from the rotation of the first housing relative to the second housing, to the vent member, the rotation of the first housing relative to the second housing, between the first angle and the third angle, rotates the rotational connecting member together with the vent member, and the rotation of the first housing relative to the second housing, between the third angle and the second angle, prevents transmission of the rotational force to the vent member and rotates the rotational connecting member independently from the vent member.

According to embodiments, the vent member 471 may further include a stopper 4714 formed on an outer surface, and while the first state is changing to the second state through operation, in response to the angle of the third surface 220A relative to the first surface 210A reaching the third angle, the stopper 4714 may limit rotation of the vent member 471 by being in contact with an end of the first housing 210. That is, the hinge structure further includes a stopper connected to the vent member, the first surface and the third surface which define the third angle therebetween, dispose the stopper in contact with an end of the first housing, and the stopper in contact with the end of the first housing limits rotation of the vent member during the rotation of the first housing relative to the second housing, between the third angle and the second angle.

According to embodiments, an electronic device 201 may include a first housing 210 including a first surface 210A and a second surface 210B opposite to the first surface 210A, a second housing 220 including a third surface 220A and a fourth surface 220B opposite to the third surface 220A, a display 230 visually exposed through the third surface 220A, one or more fan component 350 disposed in a first space 2100 inside the first housing 210, and a hinge structure 370 rotatably connecting the first housing 210 and the second housing 220 allowing change between a first state in which the first surface 210A and the third surface 220A form a first angle facing each other and a second state in which the first surface 210A and the third surface 220A form a second angle, where the first housing 210 may include an opening 360 including an intake portion 361 configured to suck air into the first space 2100 from the outside according to an operation of the fan component 350 and exhaust portions 362a and 362b configured to discharge air from the first space 2100 to the outside, and the hinge structure 370 may include a rotating member 472 connecting the first housing 210 and the second housing 220 and configured to rotate about the rotation axis A according to the rotation of the second housing 220 relative to the first housing 210, based on a third state in which the first surface 210A and the third surface 220A form a third angle between the first angle and the second angle, a vent member 471 including a first vent portion 4711 through which the intake portion 361 communicates with the outside, and a second vent portion 4712 through which the exhaust portions 362a and 362b communicate with the outside, and a connecting member 473 connecting the rotating member 472 and the vent member 471, and the connecting member 473 may transmit a rotational force of the rotating member 472 to the vent member 471 during a change between the first state and the third state, and prevent transmission of the rotational force of the rotating member 472 to the vent member 471 during a change between the third state and the second state. In an embodiment, the rotation of the first housing relative to the second housing, between the first angle and a third angle between the first angle and the second angle, rotates the rotational connecting member together with the vent member, and the rotation of the first housing relative to the second housing, between the third angle and the second angle, prevents transmission of the rotational force to the vent member, to stop rotation of the vent member.

What is claimed is:

1. An electronic device, comprising:
a first housing comprising a first surface at a front side of the electronic device, a second surface which is opposite to the first surface and at a rear side of the electronic device, an inner space in communication with an outside of the first housing, an intake opening connected to the inner space and through which air flows to the inner space from the outside of the first housing, and an exhaust opening connected to the inner space and through which air flows from the inner space to the outside of the first housing;

a second housing comprising a third surface at the front side of the electronic device, and a fourth surface which is opposite to the third surface and at the rear side of the electronic device;
a display visually exposed at the third surface;
a fan which is in the inner space of the first housing; and
a hinge structure rotatably connecting the first housing and the second housing to each other, about a rotation axis, the hinge structure comprising:
a vent member which rotates about the rotation axis, together with rotation of the first housing relative to the second housing, and
the vent member comprising:
a first vent portion which guides first air flow between the intake opening and an outside of the electronic device, together with operation of the fan, and
a second vent portion which guides second air flow between the exhaust opening and the outside of the electronic device, together with the operation of the fan,
wherein
the first surface and the third surface which face each other define a first angle between the first housing and the second housing,
the first surface and the third surface which are disposed at a maximum rotational distance from each other define a second angle between the first housing and the second housing, and
the first surface and the third surface which define a third angle between the first angle and the second angle, rotates the vent member to dispose the first vent portion guiding the first air flow in a direction relative to the front side of the electronic device, together with the second vent portion guiding the second air flow in a different direction from that of the first vent portion, relative to the front side of the electronic device.

2. The electronic device of claim 1, wherein
the rotation of the first housing relative to the second housing, between the first angle and the third angle, rotates the vent member, and
the rotation of the first housing relative to the second housing, between the third angle and the second angle, stops rotation of the vent member.

3. The electronic device of claim 2, wherein
the hinge structure further comprises a stopper connected to the vent member,
the first surface and the third surface which define the third angle therebetween, dispose the stopper in contact with an end of the first housing, and
the stopper in contact with the end of the first housing, limits rotation of the vent member during the rotation of the first housing relative to the second housing, between the third angle and the second angle.

4. The electronic device of claim 2, wherein the hinge structure further comprises a rotational connecting member which is fixed to and rotatable together with the second housing, connects the second housing to the hinge structure, at the vent member, and transmits a rotational force from the rotation of the first housing relative to the second housing, to the vent member.

5. The electronic device of claim 4, wherein
the rotation of the first housing relative to the second housing, between the first angle and the third angle, rotates the rotational connecting member together with the vent member; and the rotation of the first housing relative to the second housing, between the third angle and the second angle, prevents transmission of the rotational force to the vent member and rotates the rotational connecting member independently from the vent member.

6. The electronic device of claim 4, wherein the rotational connecting member further comprises:
a rotating member at which the rotational connecting member is fixed to the second housing, and
a connecting member connecting the rotating member and the vent member to each other, the connecting member transmitting the rotational force to the vent member,
wherein
the connecting member comprises a first fastening portion engageable with the rotating member,
the rotating member comprises a second fastening portion at which the first fastening portion of the connecting member is engaged,
the rotation of the first housing relative to the second housing, between the first angle and the third angle, engages the first and second fastening portions, and
the rotation of the first housing relative to the second housing, between the third angle and the second angle, disposes the first and second fastening portions disengaged with each other.

7. The electronic device of claim 6, wherein
the vent member further comprises a concave portion defined at an end of the vent member,
the first fastening portion overlaps the concave portion of the vent member, and
the rotation of the first housing relative to the second housing, between the third angle and the second angle, presses the first fastening portion toward the concave portion to separate the first fastening portion from the second fastening portion.

8. The electronic device of claim 6, wherein
the connecting member comprises an elastic material, and
the rotation of the first housing relative to the second housing, between the third angle and the second angle, deforms the first fastening portion in the direction of the rotation axis, to separate the first fastening portion from the second fastening portion.

9. The electronic device of claim 1, wherein the first surface and the third surface which define the third angle therebetween,
define the first air flow guided by the first vent portion, from the first surface and the third surface each at the front side of the electronic device, and toward the intake opening of the first housing,
together with defining the second air flow guided by the second vent portion, from the exhaust opening of the first housing, toward the second surface and the fourth surface each at the rear side of the electronic device.

10. The electronic device of claim 9, wherein
the vent member defines an air flow direction along the vent member, relative to the front side of the electronic device, and
the first surface and the third surface which define the third angle therebetween, and the first surface and the third surface which define the second angle therebetween, rotate the vent member to define a same air flow direction along the vent member.

11. The electronic device of claim 1, wherein the first surface and the third surface which define the first angle therebetween,
dispose the first vent portion of the hinge structure rotated to close the intake opening of the first housing, together with disposing the second vent portion of the hinge structure rotated to close the exhaust opening of the first housing.

12. The electronic device of claim 1, wherein within the hinge structure,
the first vent portion comprises an inwardly concave shape open in a direction, relative to the rotation axis, and
the second vent portion comprises an inwardly concave shape open in a different direction from the direction of the inwardly concave shape of the first vent portion, relative to the rotation axis.

13. The electronic device of claim 1, wherein within the vent member,
the second vent portion is provided in plural to define second vent portions, and
along the rotation axis, the second vent portions are on opposite sides of the first vent portion, respectively.

14. The electronic device of claim 1, wherein within the vent member,
the first vent portion and the second vent portion are each provided in plural to respectively define a plurality of first vent portions and a plurality of second vent portions, and
the plurality of first vent portions alternate with the plurality of second vent portions, along the rotation axis.

15. The electronic device of claim 1, wherein within the vent member, the first vent portion and the second vent portion are spaced apart from each other along the rotation axis.

16. An electronic device, comprising:
a first housing comprising a first surface at a front side of the electronic device, a second surface which is opposite to the first surface and at a rear side of the electronic device, an inner space in communication with an outside of the first housing, an intake opening connected to the inner space and through which air flows to the inner space from the outside of the first housing, and an exhaust opening connected to the inner space and through which air flows from the inner space to the outside of the first housing;
a second housing rotatable relative to the first housing, about a rotation axis, the second housing comprising a third surface at the front side of the electronic device, and a fourth surface which is opposite to the third surface and at the rear side of the electronic device;
a display visually exposed at the third surface;
a fan which is in the inner space of the first housing; and
a hinge structure at the rotation axis and rotatably connecting the first housing and the second housing to each other, the hinge structure comprising:
a vent member which is extended parallel to the rotation axis, the vent member comprising a first vent portion which faces the intake opening, and a second vent portion which faces the exhaust opening,
wherein the vent member rotates about the rotation axis, together with rotation of the first housing relative to the second housing, and guides air flow relative to the electronic device, together with operation of the fan,
wherein
the first surface and the third surface which face each other define a first angle between the first housing and the second housing, the first surface and the third surface which are disposed at a maximum rotational distance from each other define a second angle between the first housing and the second housing, and
the first surface and the third surface which define a third angle between the first angle and the second angle, rotates the vent member to dispose the first vent portion guiding a first air flow from the first surface and the third surface each at the front side of the electronic device, toward the intake opening of the first housing, together with defining a second air flow guided by the second vent portion, from the exhaust opening of the first housing, toward the second surface and the fourth surface each at the rear side of the electronic device.

17. The electronic device of claim 16, wherein
the rotation of the first housing relative to the second housing, between the first angle and the third angle, rotates the vent member, and
the rotation of the first housing relative to the second housing, between the third angle and the second angle, stops rotation of the vent member.

18. The electronic device of claim 16, wherein the hinge structure further comprises:
a rotational connecting member which is fixed to and rotatable together with the second housing, connects the second housing to the hinge structure, at the vent member, and transmits a rotational force from the rotation of the first housing relative to the second housing, to the vent member,
the rotation of the first housing relative to the second housing, between the first angle and the third angle, rotates the rotational connecting member together with the vent member; and
the rotation of the first housing relative to the second housing, between the third angle and the second angle, prevents transmission of the rotational force to the vent member and rotates the rotational connecting member independently from the vent member.

19. The electronic device of claim 18, wherein
the hinge structure further comprises a stopper connected to the vent member,
the first surface and the third surface which define the third angle therebetween, dispose the stopper in contact with an end of the first housing, and
the stopper in contact with the end of the first housing limits rotation of the vent member during the rotation of the first housing relative to the second housing, between the third angle and the second angle.

20. An electronic device, comprising:
a first housing comprising a first surface at a front side of the electronic device, a second surface which is opposite to the first surface and at a rear side of the electronic device, an inner space in communication with an outside of the first housing, an intake opening connected to the inner space and through which air flows to the inner space from the outside of the first housing, and an exhaust opening connected to the inner space and through which air flows from the inner space to outside the first housing;
a second housing comprising a third surface at the front side of the electronic device, and a fourth surface which is opposite to the third surface and at the rear side of the electronic device;
a display visually exposed at the third surface;
a fan which is in the inner space of the first housing; and a hinge structure rotatably connecting the first housing and the second housing to each other, the hinge structure comprising:
- a vent member which rotates about the rotation axis, together with rotation of the first housing relative to the second housing, the vent member comprising:
  - a first vent portion which guides first air flow between the intake opening and outside of the electronic device, together with operation of the fan, and
  - a second vent portion which guides second air flow between the exhaust opening and the outside of the electronic device, together with operation of the fan, and
- a rotational connecting member which is fixed to and rotatable together with the second housing, connects the second housing to the hinge structure, at the vent member, and transmits a rotational force from the rotation of the first housing relative to the second housing, to the vent member, wherein the first surface and the third surface which face each other define a first angle between the first housing and the second housing, the first surface and the third surface which are disposed at a maximum rotational distance from each other define a second angle between the first housing and the second housing, the rotation of the first housing relative to the second housing, between the first angle and a third angle which is between the first angle and the second angle, rotates the rotational connecting member together with the vent member; and the rotation of the first housing relative to the second housing, between the third angle and the second angle, prevents transmission of the rotational force to the vent member, to stop rotation of the vent member.

* * * * *